(12) United States Patent
Kambe et al.

(10) Patent No.: US 7,897,269 B2
(45) Date of Patent: Mar. 1, 2011

(54) ORGANIC EL ELEMENTS AND PROCESS FOR FABRICATION THEREOF

(75) Inventors: Emiko Kambe, Tokyo (JP); Akira Ebisawa, Tokyo (JP); Satoshi Shirai, Tokyo (JP); Masahiro Shinkai, Tokyo (JP); Tetsushi Inoue, Tokyo (JP)

(73) Assignee: TDK Corporation, Tokyo (JP)

( * ) Notice: Subject to any disclaimer, the term of this patent is extended or adjusted under 35 U.S.C. 154(b) by 529 days.

(21) Appl. No.: 10/922,218

(22) Filed: Aug. 20, 2004

(65) Prior Publication Data

US 2005/0129979 A1 Jun. 16, 2005

(30) Foreign Application Priority Data

Aug. 20, 2003 (JP) ............................. P2003-296531

(51) Int. Cl.
*B05D 5/06* (2006.01)
*H01J 1/62* (2006.01)

(52) U.S. Cl. ................... 428/690; 428/917; 313/504; 313/506; 427/66

(58) Field of Classification Search ................. 428/690, 428/917, 332, 212; 313/504, 506; 257/40
See application file for complete search history.

(56) References Cited

U.S. PATENT DOCUMENTS

| 6,344,285 | B1 | 2/2002 | Kwon et al. |
| 6,444,334 | B1 | 9/2002 | Doi et al. |
| 6,696,181 | B2 | 2/2004 | Okunaka et al. |
| 6,814,887 | B2 | 11/2004 | Okunaka et al. |
| 6,936,409 | B2 | 8/2005 | Okunaka et al. |
| 7,157,142 | B2 * | 1/2007 | Tateishi et al. ............ 428/411.1 |
| 2002/0093283 | A1 * | 7/2002 | Seo et al. ..................... 313/504 |
| 2006/0040137 | A1 * | 2/2006 | Kambe et al. ............... 428/690 |
| 2006/0115681 | A1 * | 6/2006 | Kambe et al. ............... 428/690 |

FOREIGN PATENT DOCUMENTS

| EP | 1143 773 A1 | 10/2001 |
| JP | A-02-195683 | 8/1990 |
| JP | A 02-195683 | 8/1990 |
| JP | A-09-245511 | 9/1997 |
| JP | B2 2793383 | 6/1998 |

(Continued)

OTHER PUBLICATIONS

Yi Wei Qi, "Comprehensive List of OLED Organic Materials," Electronic Materials, Sub Industry: Materials related to EL display (C3), Aug. 5, 2001 (w/ partial translation).

(Continued)

*Primary Examiner*—D. Lawrence Tarazano
*Assistant Examiner*—Camie S Thompson
(74) *Attorney, Agent, or Firm*—Oliff & Berridge, PLC

(57) ABSTRACT

Organic EL elements provided with a substrate 10, a first electrode layer 12 and a second electrode layer 18 situated in a mutually opposing manner on one side of the substrate 10, and a luminescent layer 20 situated between the electrode layers, wherein one of the first electrode layer 12 and the second electrode layer 18 is a hole injection electrode layer and the other is an electron injection electrode layer, and there is formed in the luminescent layer 20 a modified section 16 which contains an organic polymer compound different from the organic compound composing the luminescent layer 14, in bias toward the electron injection electrode layer.

31 Claims, 16 Drawing Sheets

FOREIGN PATENT DOCUMENTS

| | | |
|---|---|---|
| JP | A-11-251066 | 9/1999 |
| JP | A-11-273867 | 10/1999 |
| JP | A 2000-150165 | 5/2000 |
| JP | A-2000-252069 | 9/2000 |
| JP | A 2001-189193 | 7/2001 |
| JP | A-2002-170667 | 6/2002 |
| JP | A 2002-319488 | 10/2002 |
| JP | A 2003-7472 | 1/2003 |
| JP | A-2003-013056 | 1/2003 |
| JP | A-2003-077673 | 3/2003 |
| JP | A 2004-172102 | 6/2004 |

OTHER PUBLICATIONS

Office Action issued on Jun. 30, 2009 in a counterpart Japanese Patent Application.

Sep. 21, 2010 Office Action issued in Japanese Patent Application No. 2009-198664 (translation only).

May 26, 2006 International Preliminary Report on Patentability issued in PCT Application No. PCT/JP2004/012024.

Dec. 21, 2010 Office Action issued in Japanese Patent Application No. 2009-198664 (with translation).

\* cited by examiner

ORGANIC EL ELEMENTS AND PROCESS FOR FABRICATION THEREOF

BACKGROUND OF THE INVENTION

1. Field of the Invention

The present invention relates to organic EL (electroluminescence) elements and to a process for their fabrication.

2. Related Background Art

The announcement by Kodak Corp. of a laminated organic EL element having an organic layer formed by vacuum vapor deposition using a low molecular compound eventually led to energetic development of organic EL displays, many of which are currently being implemented. At the same time, organic EL elements employing luminescent polymer compounds in the organic layers, which exhibit excellent thermal stability, are also being actively developed. Using a polymer compound in the organic layer not only produces excellent thermal stability but also allows the organic layer to be formed by a coating method using a coating solution, thus affording the advantage of simplifying the production process. In addition, an organic layer formed using vacuum vapor deposition includes sections with no layer formation, often leading to defects, whereas an organic layer formed by coating is highly resistant to defects and is highly reliable.

Nevertheless, when laminating an organic EL element using a polymer compound, it is necessary to select, as the solvent of the coating solution used for formation of the organic layer, a solvent which does not notably affect the properties of the polymer compounds in the other layers. Such solvent selection is very difficult, and therefore as the organic EL element using a polymer compound, an element having a single organic layer structure is usually employed, except when using PEDOT/PSS, which is a water-dispersible material which can be used for the hole injection layer.

An organic EL element having a single organic layer structure must have the single organic layer exhibiting the function of carrier transport, carrier recombination and luminescence. However, organic EL elements employing conventional polymer compounds do not effectively exhibit all of these functions due to carrier balance shift and the like, and they have therefore often been inadequate from the standpoint of element characteristics such as luminescent efficiency, heat resistance and usable life. A demand has existed, therefore, for an organic EL element employing a polymer compound with excellent element characteristics, from the viewpoint of production process reliability (yield) and production cost.

Several laminated organic EL elements using polymer compounds in the organic layers have been proposed to meet this demand. For example, Japanese Patent Application Laid-Open No. 2000-150165 proposes an organic EL element wherein a solution comprising a mixture of an alcohol-soluble buffer polymer and an electron transport material is coated to form an electron transport layer on the luminescent layer.

Also, Japanese Patent No. 2793383 proposes an organic EL element having an insulating metal oxide with an energy gap of 4.0 eV or greater inserted between the luminescent layer and the cathode, for the purpose of improving adhesion of the metal used in the cathode to permit uniform luminescence, and for increased recombination between the electrons and positive holes.

SUMMARY OF THE INVENTION

However, when the present inventors carefully studied the organic EL element employing a polymer compound as described in Japanese Patent Application Laid-Open No. 2000-150165, it was found that even this type of organic EL element does not result in adequately high luminescent efficiency and usable life. Specifically, emission of light by the organic EL element described in Japanese Patent Application Laid-Open No. 2000-150165 requires setting of a high driving voltage, while the time for the brightness to be reduced by half (hereinafter referred to as the "brightness half-life") has not been satisfactory. This has been attributed to the low carrier mobility of the buffer polymer (for example, polyvinylpyrrolidone) in the electron transport layer, which prevents electron injection into the luminescent layer.

In other words, fewer injected electrons with respect to the number of holes leads to an excess of holes which cannot be recombined in the luminescent layer. This excess of holes will not be recombined with electrons in the luminescent layer, and thus will not contribute to luminescence of the organic EL element.

Also, even when a metal insulator is inserted between the luminescent layer and cathode as according to the construction described in Japanese Patent No. 2793383, the luminescent efficiency and usable life are insufficient, sometimes resulting in dark spots.

It is an object of the present invention to provide organic EL elements which can achieve adequately high luminescent efficiency and usable life, as well as a process for their fabrication.

In order to solve the problems described above, the invention provides organic EL elements according to the following (1) to (5).

(1) An organic EL element provided with a substrate, a first electrode layer and second electrode layer situated in a mutually opposing manner on one side of the substrate, and a luminescent layer situated between the electrode layers, wherein one of said first electrode layer and said second electrode layer is a hole injection electrode layer and the other is an electron injection electrode layer, and there is formed in said luminescent layer a modified section which contains an organic polymer compound different from the organic compound of said luminescent layer, in bias toward said electron injection electrode layer (hereinafter referred to as "first organic EL element").

(2) An organic EL element provided with a substrate, a first electrode layer and second electrode layer situated in a mutually opposing manner on one side of the substrate, and a luminescent layer situated between the electrode layers, wherein one of said first electrode layer and said second electrode layer is a hole injection electrode layer and the other is an electron injection electrode layer, and there is formed between said luminescent layer and said electron injection electrode layer an organic thin-film layer composed of an organic polymer compound which satisfies the following inequality (1) and inequality (2) (hereinafter referred to as "second organic EL element").

$$|EA_{LL}| - |EA_{OTL}| \geq 0.3 \text{ eV} \quad (1)$$

$$|IP_{OTL}| - |IP_{LL}| \geq 0.3 \text{ eV} \quad (2)$$

[where $EA_{LL}$ is the electron affinity of said luminescent layer, $EA_{OTL}$ is the electron affinity of said organic thin-film layer, $IP_{OTL}$ is the ionization potential of said organic thin-film layer, and $IP_{LL}$ is the ionization potential of said luminescent layer.]

(3) An organic EL element provided with a substrate, a first electrode layer and second electrode layer situated in a mutually opposing manner on one side of the substrate, and a luminescent layer situated between the electrode layers, wherein one of said first electrode layer and said second electrode layer is a hole injection electrode layer and the other is an electron injection electrode layer, and there is formed between said luminescent layer and said electron injection electrode layer an organic thin-film layer composed of an organic polymer compound with an energy gap of 3.5 eV or greater (hereinafter referred to as "third organic EL element").

(4) An organic EL element provided with a substrate, a first electrode layer and second electrode layer situated in a mutually opposing manner on one side of the substrate, and a luminescent layer situated between the electrode layers, wherein one of said first electrode layer and said second electrode layer is a hole injection electrode layer and the other is an electron injection electrode layer, there is formed between said luminescent layer and said electron injection electrode layer an organic thin-film layer composed of an organic polymer compound which satisfies inequality (1) and inequality (2) above, and there is formed in said luminescent layer a modified section which contains an organic polymer compound different from the organic compound of said luminescent layer, in bias toward said electron injection electrode layer (hereinafter referred to as "fourth organic EL element").

(5) An organic EL element provided with a substrate, a first electrode layer and second electrode layer situated in a mutually opposing manner on one side of the substrate, and a luminescent layer situated between the electrode layers, wherein one of said first electrode layer and said second electrode layer is a hole injection electrode layer and the other is an electron injection electrode layer, there is formed between said luminescent layer and said electron injection electrode layer an organic thin-film layer composed of an organic polymer compound with an energy gap of 3.5 eV or greater, and there is formed in said luminescent layer a modified section which contains an organic polymer compound different from the organic compound of said luminescent layer, in bias toward said electron injection electrode layer (hereinafter referred to as "fifth organic EL element").

The first, fourth and fifth organic EL elements include, in the luminescent layer containing an organic compound, a modified section which contains a polymer compound different from the organic compound. The polymer compound is not evenly distributed throughout the luminescent layer but is present in a biased concentration toward the electron injection electrode layer side of the luminescent layer.

The second and fourth organic EL elements are provided with an organic layer composed of an organic polymer compound between the luminescent layer and the electron injection electrode layer, wherein the organic polymer compound satisfies inequality (1) and inequality (2) above, and the organic layer is an organic thin-film layer.

The third and fifth organic EL elements are provided with an organic layer composed of an organic polymer compound between the luminescent layer and the electron injection electrode layer, wherein the organic polymer compound has an energy gap of 3.5 eV or greater, and the organic layer is an organic thin-film layer. The term "thin-film" used in reference to the organic thin-film layer means that the film thickness is less than that of the luminescent layer and the film thickness is typically less than 20 nm (more typically less than 10 nm).

The first to fifth organic EL elements exhibit sufficiently high luminescent efficiency and have a long usable life, mainly due to the features of being provided with the modified section and/or organic thin-film layer. Although the reason for this effect is not completely understood, the conjecture of the present inventors is as follows.

Specifically, a conventional organic EL element has a relatively large difference in carrier (hole or electron) mobility between the layers in which mostly electron migration occurs (electron injection layer, electron transport layer and luminescent layer) and the layers in which mostly hole migration occurs (hole injection layer, hole transport layer and luminescent layer), and therefore the number of recombinations between holes and electrons is reduced in the luminescent layer. When no recombination between holes and electrons occurs in the luminescent layer, the organic EL element emits no light and the luminescent efficiency is thus reduced.

When the luminescent efficiency is reduced, the driving voltage for luminescence must be increased, while the more numerous carriers which do not contribute to recombination place a large burden on the organic layer of the organic EL element. This causes the materials of the organic layer to undergo chemical changes whereby they are converted to non-luminescent substances, while the carrier balance is also shifted, resulting in further reduced luminescent efficiency. Presumably, this leads to gradual reduction in the brightness of the organic EL element, thus shortening the brightness half-life.

On the other hand, in the first to fifth organic EL elements, an energy barrier is formed near the modified section and/or organic thin-film layer, and these regions function as blocking layers against holes whereby migration of holes from the luminescent layer toward the electron injection electrode layer can be adequately inhibited. Thus, it is believed that the holes satisfactorily accumulate in the luminescent layer, and that the accumulation of holes effectively lowers the electron injection barrier of the surrounding sections (the energy barrier necessary for injection of electrons into the luminescent layer). It thereby becomes possible to achieve an injection balance between electrons and holes, so that the probability of recombination between holes and electrons in the luminescent layer increases, and an organic EL element with sufficiently high luminescent efficiency and usable life is obtained. In addition, since direct contact between the luminescent layer and the metal electron injection electrode layer (cathode) can be prevented, it is possible to prevent inactivation of the excited state caused by energy migration.

In the first, fourth and fifth organic EL elements, an organic polymer compound satisfying inequality (1) and inequality (2) above may be used as the organic polymer compound different from the organic compound of the luminescent layer. An organic polymer compound with a fluorescent quantum efficiency of no greater than 1% may also be used.

Also, in the first, fourth and fifth organic EL elements, an organic polymer compound with an energy gap of 3.5 eV or greater may be used as the organic polymer compound different from the organic compound of the luminescent layer.

In the second to fifth organic EL elements, the film thickness of the organic thin-film layer is preferably 0.05-10 nm and more preferably 0.1-4 nm. The film thickness at the modified section of the first, fourth or fifth organic EL element may be defined as the thickness at a section where average content per unit area of the organic polymer compound contained in the modified section is 10 wt % or more, and that thickness is preferably 0.01-20 nm, more preferably 0.01-10 nm and even more preferably 0.01-5 nm. Therefore, in the fourth and fifth organic EL elements, total film thickness of the organic thin-film layer and the modified section is preferably 0.06-30 nm and more preferably 0.1-5 nm.

If the thickness of the organic thin-film layer or modified section is within this range, the luminescent efficiency of the organic EL element can be effectively improved and a satisfactorily long usable life can be achieved. If the thickness of the organic thin-film layer or modified section is below the aforementioned lower limit, the enhancing effect on the luminescent effect and usable life may be less significant. If it is above the aforementioned upper limit, passage of electrons may be impeded, resulting in raised driving voltage and insufficient luminescence.

At least one of the organic polymer compound different from the organic compound of the luminescent layer, the organic polymer compound satisfying inequality (1) and inequality (2) above, and the organic polymer compound with an energy gap of 3.5 eV or greater is preferably a polar organic polymer compound. Most polymer luminescent layers are not polar materials, and it is therefore difficult to achieve uniform adhesion of electron injection materials composed of inorganic compounds used as ultrathin films, but if the modified section or the organic thin-film layer is composed of a polar polymer, the adhesion will be improved to produce a more uniform condition, thereby facilitating high luminescent effect and long usable life.

As such polar organic polymer compounds, there may be mentioned compounds consisting of one or more of the following organic polymer compounds (a) to (c) (where the organic polymer compounds of (a) to (c) may have substituents).

(a) polymers or copolymers of compounds selected from the group consisting of vinylpyridine, (meth)acrylic acid, N-alkylacrylamide, N,N-dialkylacrylamide, hydroxy(meth)acrylate, vinyl acetate, styrene and N-vinylpyrrolidone.

(b) oxyalkylene polymers or copolymers wherein the alkyl groups have 2-4 carbon atoms.

(c) polyoxazoline or polyvinylbutyral.

As preferred examples there may be mentioned one or more organic polymer compounds selected from the group consisting of poly(2-vinylpyridine), poly(4-vinylpyridine), polyacrylic acid, polymethacrylic acid, poly(N,N-dimethylacrylamide), poly(2-hydroxyethyl acrylate), poly(2-hydroxyethyl methacrylate), poly-N-vinylpyrrolidone, polyvinyl acetate, polystyrene, substituted polystyrene, polyethylene glycol, polypropylene glycol, poly(tetramethylene ether) glycol, poly(2-ethyl-2-oxazoline) and polyvinylbutyral.

At least one of the organic polymer compound different from the organic compound of the luminescent layer, the organic polymer compound satisfying inequality (1) and inequality (2) above, and the organic polymer compound with an energy gap of 3.5 eV or greater most preferably has a number average molecular weight of 50000 or greater.

As organic compounds of the luminescent layer, there are preferably used luminescent polymer compounds. Here, a "luminescent polymer compound" is a polymer compound capable of emitting light (fluorescence, phosphorescence) when excited by recombination between holes and electrons, and this concept includes mixtures of luminescent dopant materials with luminescent polymer compounds used as host materials.

The modified section is preferably formed by coating a solution comprising a solvent and the organic polymer compound different from the organic compound of the luminescent layer. By thus employing a coating method as the method of modifying the luminescent layer of an organic EL element, a concentration gradient can be created in the modified section. Specifically, the electron injection electrode layer side of the modified section has a high concentration of the coated organic polymer compound, while the concentration of the organic compound of the luminescent layer increases gradually toward the hole injection electrode layer side of the modified section. It is conjectured that by providing such a concentration gradient, the modified section has a film thickness range of a certain size and is able to accumulate holes effectively as a graded blocking layer, thereby effectively contributing to recombination of the holes and electrons in the luminescent layer.

The organic thin-film layer is also preferably formed by coating a solution comprising a solvent and the organic polymer compound satisfying inequality (1) and inequality (2) above, or a solution comprising a solvent and the organic polymer compound with an energy gap of 3.5 eV or greater.

When the luminescent layer contains a luminescent polymer compound, the surface will have a certain degree of irregularity in its shape. It is thought that for this reason, coating the solution on the irregular surface allows relatively easy formation of a concentration gradient as described above, to contribute to effective recombination of the holes and electrons in the luminescent layer. The physical strength against top layer coating is also increased. Also, since the luminescent polymer compound and the coated organic polymer compound adhere sufficiently in the modified section, the modified section is more resistant to destruction in the organic EL element fabrication steps and during use.

In order to achieve satisfactory coating, the solvent used in the case described above preferably contains a polar solvent, and as polar solvents, there are preferred one or more polar solvents selected from the group consisting of hydroxyl group-containing linear compounds with a total of 1-10 carbon atoms, $C_{2-6}$ dialkylamide group-containing linear compounds with a total of 2-8 carbon atoms, linear esters with a total of 2-10 carbon atoms and linear carbonates with a total of 2-9 carbon atoms.

In order to facilitate electron injection from the electron injection electrode layer, there may be provided, on the hole injection electrode layer side of the electron injection electrode layer, an electron injection layer adjacent to the electron injection electrode layer and composed of a compound containing an alkali metal, alkaline earth metal or rare earth metal. The total thickness of the electron injection layer, and the modified section and/or the organic thin-film layer is preferably 0.5-25 nm.

When a metal, alloy or mixture is laminated as the electron injection layer, the element tends to undergo deterioration by oxidative degradation or diffusion of the dissociated ions to the anode, but the presence of the modified section or organic thin-film layer can stably retain the metal or metal compound, thereby driving the element in a stable manner.

The organic EL elements of the invention described above may be fabricated in a satisfactory manner by the following fabrication processes (a) to (c).

(a) A process for fabrication of an organic EL element comprising a step of forming a first electrode layer on one side of a substrate, a step of layer formation on said first electrode layer in such a manner that at least one layer is a luminescent layer, and a step of forming a second electrode layer on the uppermost layer laminated in the previous step, wherein one of said first electrode layer and said second electrode layer is formed as a hole injection electrode layer and the other is formed as an electron injection electrode layer, and a solution containing an organic polymer compound different from the organic compound of said luminescent layer is coated on the electron injection electrode layer side of said luminescent layer, to form in said luminescent layer a modified section containing said organic polymer compound in bias toward said electron injection electrode layer.

(b) A process for fabrication of an organic EL element comprising a step of forming a first electrode layer on one side of a substrate, a step of layer formation on said first electrode layer in such a manner that at least one layer is a luminescent layer, and a step of forming a second electrode layer on the uppermost layer laminated in the previous step, wherein one of said first electrode layer and said second electrode layer is formed as a hole injection electrode layer and the other is formed as an electron injection electrode layer, and there is formed as a layer between said luminescent layer and said electron injection electrode layer, an organic thin-film layer composed of an organic polymer compound satisfying inequality (1) and inequality (2) above.

(c) A process for fabrication of an organic EL element comprising a step of forming a first electrode layer on one side of a substrate, a step of layer formation on said first electrode layer in such a manner that at least one layer is a luminescent layer, and a step of forming a second electrode layer on the uppermost layer laminated in the previous step, wherein one of said first electrode layer and said second electrode layer is formed as a hole injection electrode layer and the other is formed as an electron injection electrode layer, and there is formed as a layer between said luminescent layer and said electron injection electrode layer, an organic thin-film layer composed of an organic polymer compound with an energy gap of 3.5 eV or greater.

In fabrication processes (a) to (c), there is preferably formed on the hole injection electrode layer side of the electron injection electrode layer an electron injection layer adjacent thereto and composed of a compound containing an alkali metal, alkaline earth metal or rare earth metal. Fabrication processes (a) and (b), or fabrication processes (a) and (c) can be combined.

The organic EL element of the invention also includes a mode having the following construction. Specifically, this is an organic EL element provided with a substrate, a first electrode layer formed on one side of the substrate, at least one organic layer formed on the first electrode layer, and a second electrode layer formed on the organic layer situated at the most distant position from the substrate, wherein one of the first electrode layer and the second electrode layer is a hole injection electrode layer and the other is an electron injection electrode layer, and at least one of the organic layers is a luminescent layer which has a modified section containing a non-luminescent polymer compound, near the surface on the electron injection electrode layer side.

The term "near the surface" of the luminescent layer refers to the volume region from the surface of the luminescent layer to, at most, the center of the luminescent layer in the thickness direction. "Non-luminescent" means a fluorescent quantum efficiency of no greater than 1%. Also, "modified section containing a non-luminescent polymer compound" refers to the layer section which contains both the material composing the luminescent layer at sections other than the modified section, and the non-luminescent polymer compound, in the thickness direction of the luminescent layer, and excludes the layer sections which do not contain the non-luminescent polymer compound.

For illustration of the modified section described above, FIG. 16 shows a cross-sectional view of the area near the surface of a luminescent layer 20, wherein the luminescent layer 20 uses a polymer luminescent material as the luminescent material. In FIG. 16, the section indicated by reference numeral 16 is the modified section, and particles 22 of the non-luminescent polymer compound are present at all positions in the thickness direction. Also, the sections other than the modified section are indicated by reference numeral 14 and contain no particles 22 of the non-luminescent polymer compound at any position in the thickness direction.

In this mode, the modified section of the luminescent layer is preferably formed by coating a solution containing the non-luminescent polymer compound, and has a thickness of the non-luminescent polymer compound of preferably $5.0\times10^{-9}$ to $1.0\times10^{-6}$ g/cm$^2$ and more preferably $2.5\times10^{-8}$ to $5.0\times10^{-7}$ g/cm$^2$. The "thickness" of the non-luminescent polymer compound referred to here is the value obtained by dividing the mass of the non-luminescent polymer compound present near the surface of the luminescent layer by the external area of the surface of the luminescent layer containing the non-luminescent polymer compound (the area excluding the surface irregularities). In this mode, the luminescent layer preferably contains a luminescent polymer compound, and the solution preferably contains a polar solvent.

The process for fabrication of the organic EL element according to this mode may be a fabrication process comprising a step of preparing a substrate, a step of forming a first electrode layer on one side of the substrate, a step of forming at least one organic layer on the first electrode layer, a step of coating a solution containing a non-luminescent polymer compound on the surface of the luminescent layer (of the organic layers), after forming the luminescent layer and before forming the other layers on the luminescent layer, and a step of forming a second electrode layer on the organic layer which is situated at the most distant position from the substrate.

DESCRIPTION OF THE PREFERRED EMBODIMENTS

Preferred embodiments of the invention will now be explained in detail with reference to the accompanying drawings as necessary.

Figure 1:
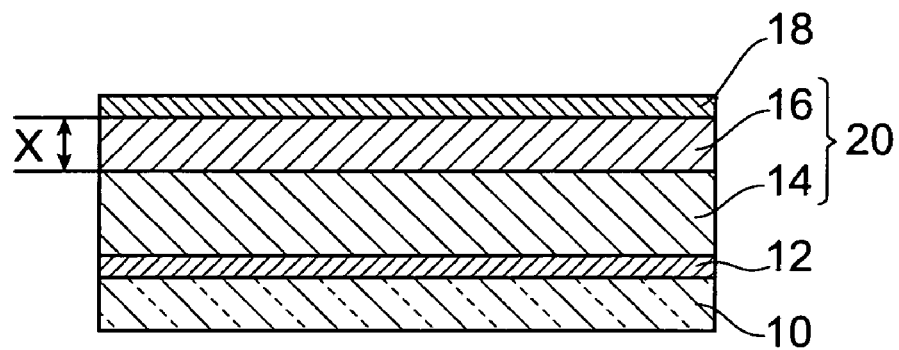
FIG. 1 is a schematic cross-sectional view of an organic EL element according to a first embodiment.

FIG. 1 is a schematic cross-sectional view of an organic EL element according to a first embodiment of the invention, corresponding to the first organic EL element described above. The organic EL element of the first embodiment shown in FIG. 1 is provided with a substrate 10, a first electrode layer 12 and a second electrode layer 18 situated in a mutually opposing manner on one side of the substrate 10, and a luminescent layer 20 situated between the electrode layers, wherein the first electrode layer 12 is a hole injection electrode layer and the second electrode layer 18 is an electron injection electrode layer, and a modified section 16 which comprises an organic polymer compound different from the organic compound of the luminescent layer (the luminescent layer other than at the modified section, hereinafter referred to as "non-modified luminescent layer 14") is formed in the luminescent layer 20, in bias toward the electron injection electrode layer (i.e., toward the second electrode layer 18). In the organic EL element of this first embodiment, the interface between the modified section 16 and the non-modified luminescent layer 14 is on a roughly parallel plane with respect to the substrate 10.

Figure 2:
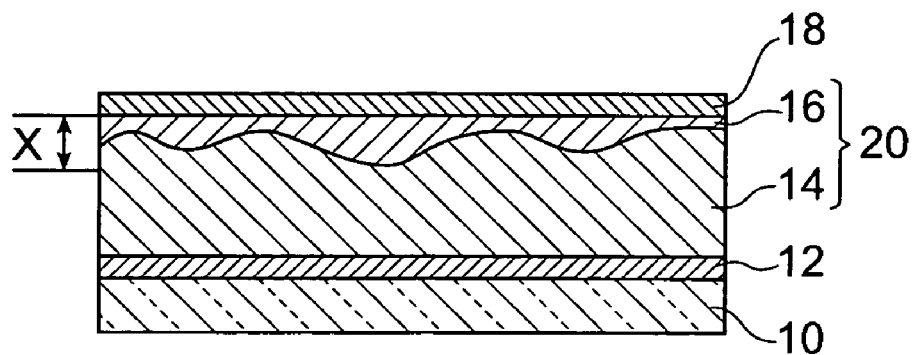
FIG. 2 is a schematic cross-sectional view of a first variant mode of an organic EL element according to the first embodiment.

FIG. 2 is a schematic cross-sectional view of a first variant mode of an organic EL element according to the first embodiment, wherein the interface between the modified section 16 and the non-modified luminescent layer 14 is not on a parallel plane with respect to the substrate 10, as the interface forms an irregular surface. In this mode, a distinct interface exists between the modified section 16 and the non-modified luminescent layer 14.

Figure 3:
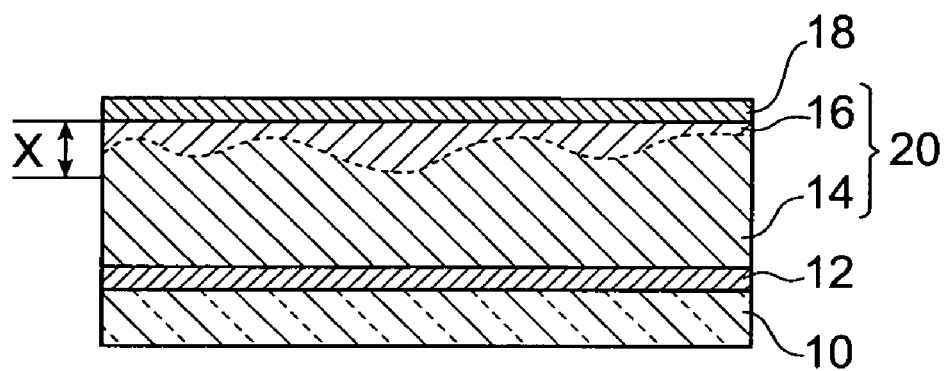
FIG. 3 is a schematic cross-sectional view of a second variant mode of an organic EL element according to the first embodiment.

FIG. 3 is a schematic cross-sectional view of a second variant mode of an organic EL element according to the first embodiment, wherein the interface between the modified section 16 and the non-modified luminescent layer 14 is not on a parallel plane with respect to the substrate 10, as the interface forms an irregular surface; however, no distinct interface exists between the modified section 16 and the non-modified luminescent layer 14, and a region is present wherein the component of the modified section 16 and the component of the non-modified luminescent layer 14 are mixed in a desired proportion.

Figure 4:
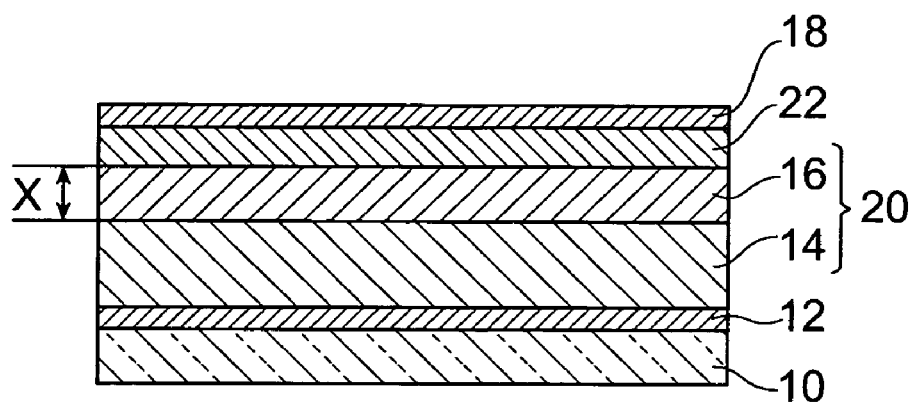
FIG. 4 is a schematic cross-sectional view of an organic EL element according to a second embodiment.

FIG. 4 is a schematic cross-sectional view of an organic EL element according to a second embodiment of the invention, which corresponds to the first organic EL element described above. The organic EL element of the second embodiment shown in FIG. 4 has the same structure as the first embodiment, except that an electron injection layer 22 is provided between the modified section 16 and the second electrode layer 18. While not shown in this drawing, the organic EL element of the second embodiment may also have a mode wherein the interface between the modified section 16 and the non-modified luminescent layer 14 is constructed in the same manner as the first and second variant modes of the first embodiment.

Figure 5:
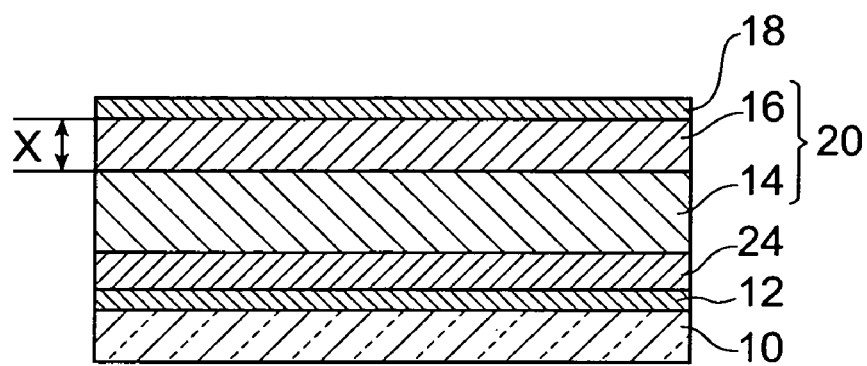
FIG. 5 is a schematic cross-sectional view of an organic EL element according to a third embodiment.

FIG. 5 is a schematic cross-sectional view of an organic EL element according to a third embodiment of the invention, which corresponds to the first organic EL element described above. The organic EL element of the third embodiment shown in FIG. 5 has the same structure as the first embodiment, except that a hole injection layer 24 is provided between the first electrode layer 12 and the non-modified luminescent layer 14. While not shown in this drawing, the organic EL element of the third embodiment may also have a mode wherein the interface between the modified section 16 and the non-modified luminescent layer 14 is constructed in the same manner as the first and second variant modes of the first embodiment.

Figure 6:
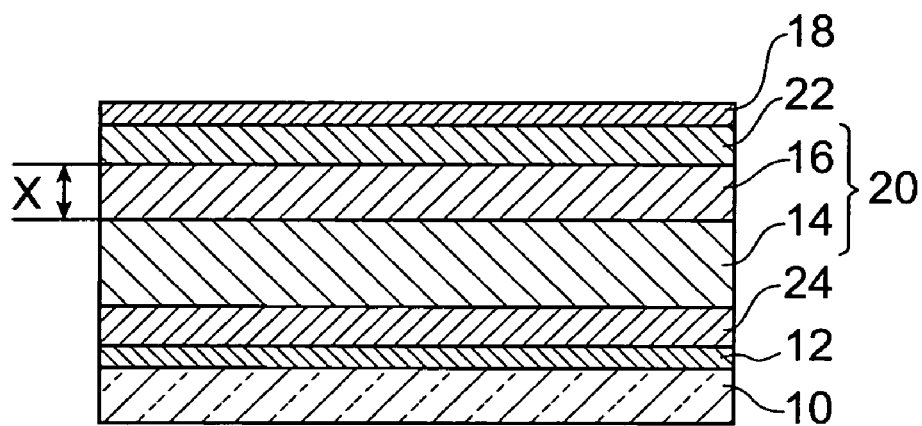
FIG. 6 is a schematic cross-sectional view of an organic EL element according to a fourth embodiment.

FIG. 6 is a schematic cross-sectional view of an organic EL element according to a fourth embodiment of the invention, which corresponds to the first organic EL element described above. The organic EL element of the fourth embodiment shown in FIG. 6 has the same structure as the second embodiment, except that a hole injection layer 24 is provided between the first electrode layer 12 and the non-modified luminescent layer 14. While not shown in this drawing, the organic EL element of the fourth embodiment may also have a mode wherein the interface between the modified section 16 and the non-modified luminescent layer 14 is constructed in the same manner as the first and second variant modes of the first embodiment.

Figure 7:
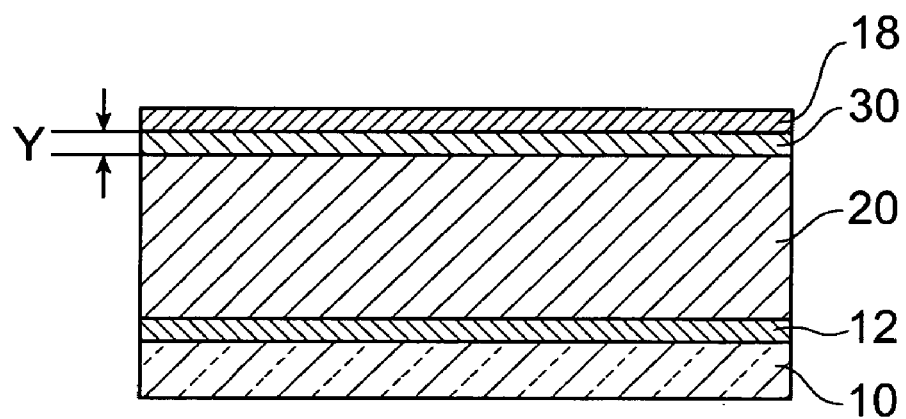
FIG. 7 is a schematic cross-sectional view of an organic EL element according to a fifth embodiment.

FIG. 7 is a schematic cross-sectional view of an organic EL element according to a fifth embodiment of the invention, which corresponds to the second organic EL element described above. The organic EL element of the fifth embodiment shown in FIG. 7 is provided with a substrate 10, a first electrode layer 12 and a second electrode layer 18 situated in a mutually opposing manner on one side of the substrate 10, and a luminescent layer 20 situated between the electrode layers, wherein the first electrode layer 12 is a hole injection electrode layer and the second electrode layer 18 is an electron injection electrode layer, and an organic thin-film layer 30 composed of an organic polymer compound satisfying inequalities (1) and (2) above is formed between the luminescent layer 20 and the second electrode layer 18.

Figure 8:
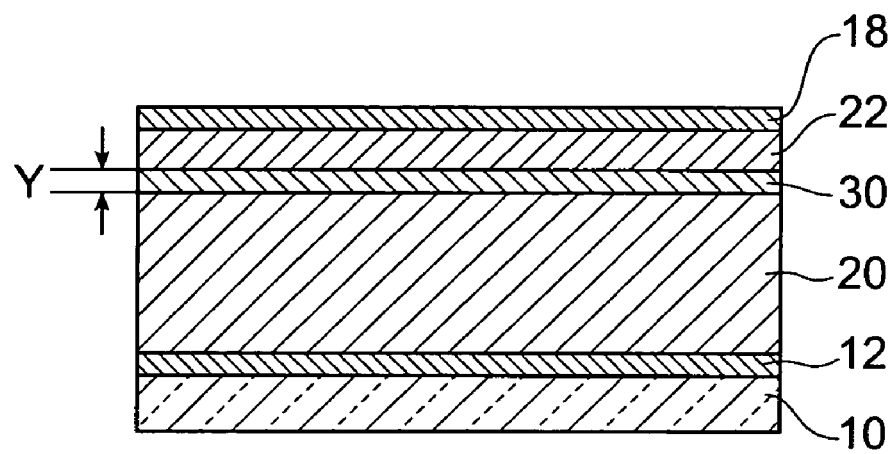
FIG. 8 is a schematic cross-sectional view of an organic EL element according to a sixth embodiment.

FIG. 8 is a schematic cross-sectional view of an organic EL element according to a sixth embodiment of the invention, which corresponds to the second organic EL element described above. The organic EL element of the sixth embodiment shown in FIG. 8 has the same structure as the fifth embodiment, except that an electron injection layer 22 is provided between the organic thin-film layer 30 and the second electrode layer 18.

Figure 9:
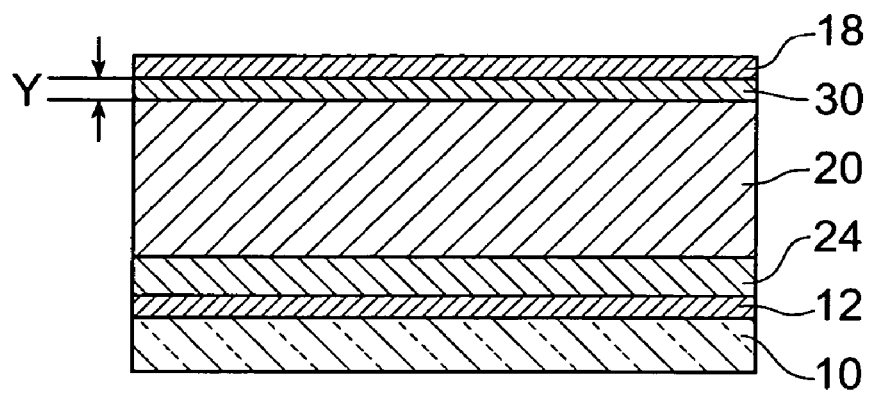
FIG. 9 is a schematic cross-sectional view of an organic EL element according to a seventh embodiment.

FIG. 9 is a schematic cross-sectional view of an organic EL element according to a seventh embodiment of the invention, which corresponds to the second organic EL element described above. The organic EL element of the seventh embodiment shown in FIG. 9 has the same structure as the fifth embodiment, except that a hole injection layer 24 is provided between the first electrode layer 12 and the luminescent layer 20.

Figure 10:
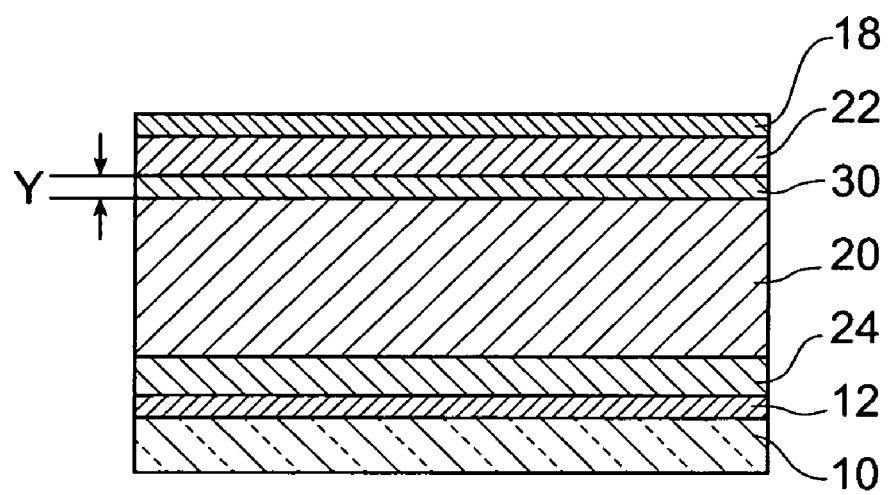
FIG. 10 is a schematic cross-sectional view of an organic EL element according to an eighth embodiment.

FIG. 10 is a schematic cross-sectional view of an organic EL element according to an eighth embodiment of the invention, which corresponds to the second organic EL element described above. The organic EL element of the eighth embodiment shown in FIG. 10 has the same structure as the sixth embodiment, except that a hole injection layer 24 is provided between the first electrode layer 12 and the luminescent layer 20.

Incidentally, by modifying the organic thin-film layer 30 of each of the organic EL elements according to the fifth, sixth, seventh and eighth embodiments from an organic polymer compound satisfying inequalities (1) and (2) above to an organic polymer compound with an energy gap of 3.5 eV or greater, it is possible to obtain the aforementioned third organic EL element corresponding to the fifth, sixth, seventh and eighth embodiments.

Figure 11:
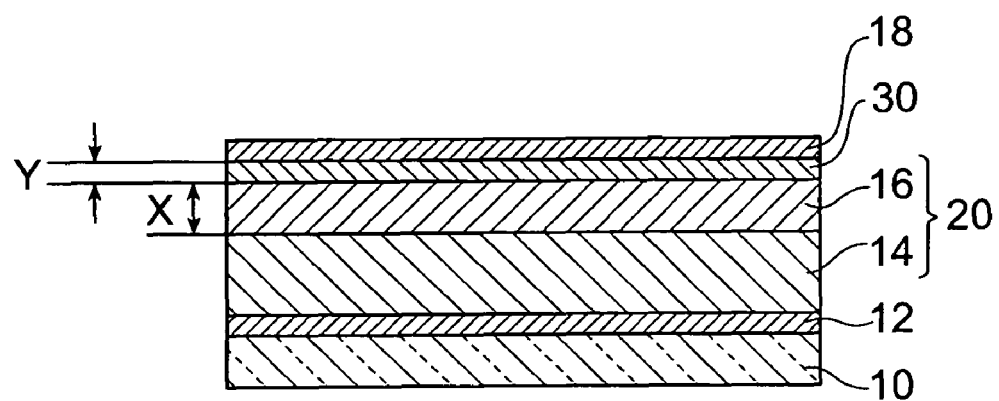
FIG. 11 is a schematic cross-sectional view of an organic EL element according to a ninth embodiment.

FIG. 11 is a schematic cross-sectional view of an organic EL element according to a ninth embodiment of the invention, which corresponds to the fourth organic EL element described above. The organic EL element of the ninth embodiment shown in FIG. 11 is provided with a substrate 10, a first electrode layer 12 and a second electrode layer 18 situated in a mutually opposing manner on one side of the substrate 10, and a luminescent layer 20 situated between the electrode layers, wherein the first electrode layer 12 is a hole injection electrode layer and the second electrode layer 18 is an electron injection electrode layer, an organic thin-film layer 30 composed of an organic polymer compound satisfying inequalities (1) and (2) above is formed between the luminescent layer 20 and the second electrode layer 18, and a modified section 16 which comprises an organic polymer compound different from the organic compound of the luminescent layer (non-modified luminescent layer 14) is formed in the luminescent layer 20, in bias toward the electron injection electrode layer (i.e., toward the second electrode layer 18).

Figure 12:
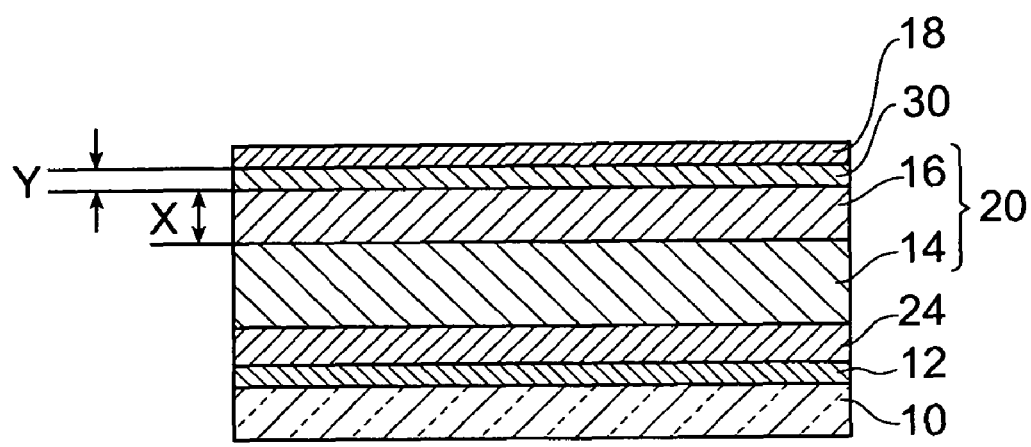
FIG. 12 is a schematic cross-sectional view of an organic EL element according to a tenth embodiment.

FIG. 12 is a schematic cross-sectional view of an organic EL element according to a tenth embodiment, which corresponds to the fourth organic EL element described above. The organic EL element of the tenth embodiment shown in FIG. 12 has the same structure as the ninth embodiment, except that a hole injection layer 24 is provided between the first electrode layer 12 and the luminescent layer 20.

Figure 13:
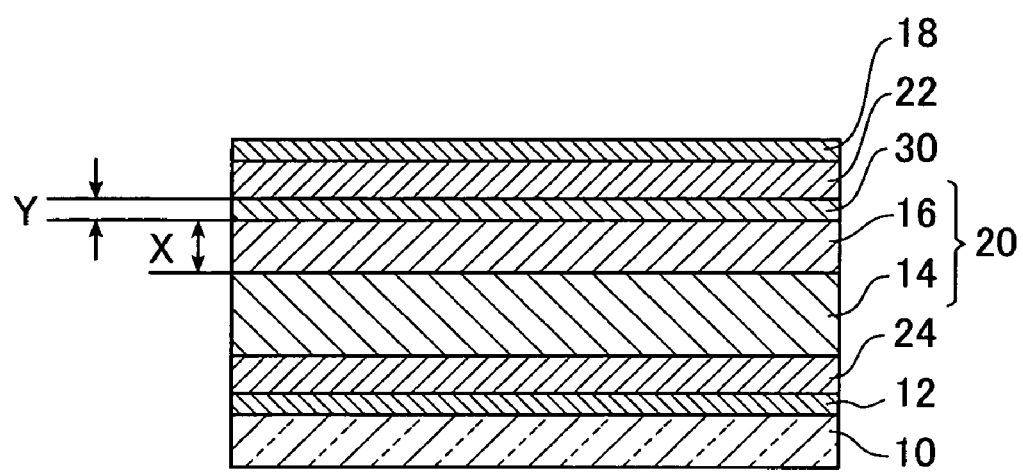
FIG. 13 is a schematic cross-sectional view of an organic EL element according to an eleventh embodiment.

FIG. 13 is a schematic cross-sectional view of an organic EL element according to an eleventh embodiment, which corresponds to the fourth organic EL element described above. The organic EL element of the eleventh embodiment shown in FIG. 13 has the same structure as the tenth embodiment, except that an electron injection layer 22 is provided between the organic thin-film layer 30 and the second electrode layer 18.

Incidentally, by modifying the organic thin-film layer 30 of each of the organic EL elements according to the ninth, tenth and eleventh embodiments from an organic polymer compound satisfying inequalities (1) and (2) above to an organic polymer compound with an energy gap of 3.5 eV or greater, it is possible to obtain the aforementioned fifth organic EL element corresponding to the ninth, tenth and eleventh embodiments.

In FIGS. 1 to 13, X represents the thickness (film thickness) of the modified section 16, and Y represents the film thickness of the organic thin-film layer 30. As explained above, the film thickness of the modified section 16 is defined as the thickness at a section where average content per unit area of the organic polymer compound contained in the modified section 16 is 10 wt % or more. The modified section 16 may be composed of 100% of an organic polymer compound different from the organic compound of the non-modified luminescent layer 14, or a mixture of this organic polymer compound and the organic compound of the non-modified luminescent layer 14. The modified section 16 preferably has a graduated structure wherein the concentration of the polymer compound decreases gradually from the second electrode layer 18 toward the first electrode layer 12.

Figure 14:
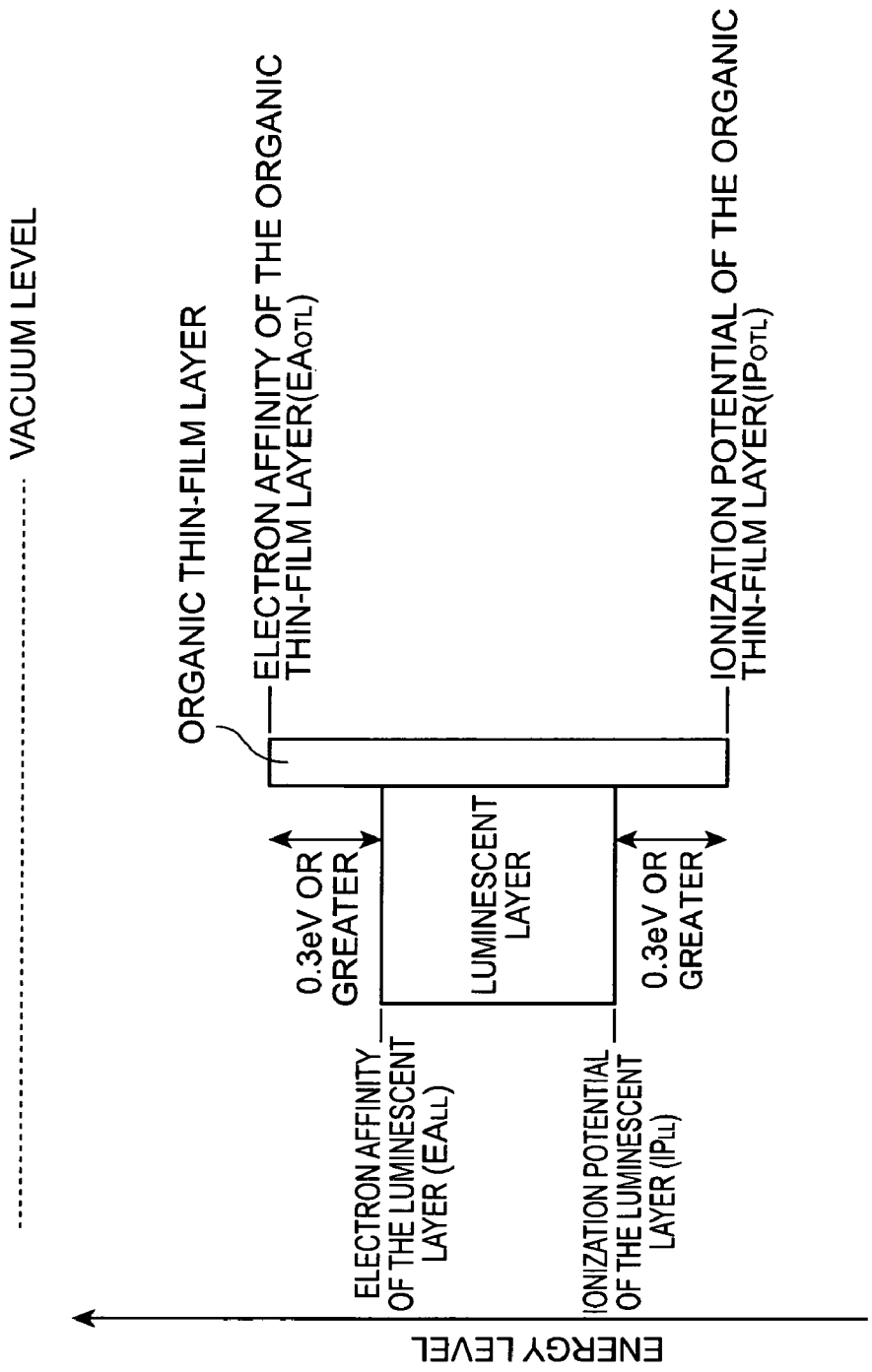
FIG. 14 is a schematic drawing showing an energy diagram for a luminescent layer and organic thin-film layer wherein the organic thin-film layer satisfies inequalities (1) and (2).

The second and fourth organic EL elements are provided with organic thin-film layers composed of organic polymer compounds satisfying inequality (1) and inequality (2). FIG. 14 is a schematic drawing showing an energy diagram for a luminescent layer and organic thin-film layer wherein the organic thin-film layer satisfies these inequalities. As seen in FIG. 14, the absolute value of the electron affinity of the luminescent layer ($|EA_{LL}|$) is larger than the absolute value of the electron affinity of the organic thin-film layer ($|EA_{OTL}|$), and the value of $|EA_{LL}|-|EA_{OTL}|$ is 0.3 eV or greater. Also, the absolute value of the ionization potential of the organic thin-film layer ($|IP_{OTL}|$) is larger than the absolute value of the ionization potential of the luminescent layer ($|IP_{LL}|$), and the value of $|IP_{OTL}|-|IP_{LL}|$ is 0.3 eV or greater. According to the invention, the value of $|EA_{LL}|-|EA_{OTL}|$ is preferably 0.4 eV or greater, and more preferably 0.5 eV or greater. Also, the value of $|IP_{OTL}|-|IP_{LL}|$ is preferably 0.4 eV or greater and more preferably 0.5 eV or greater.

Figure 15:
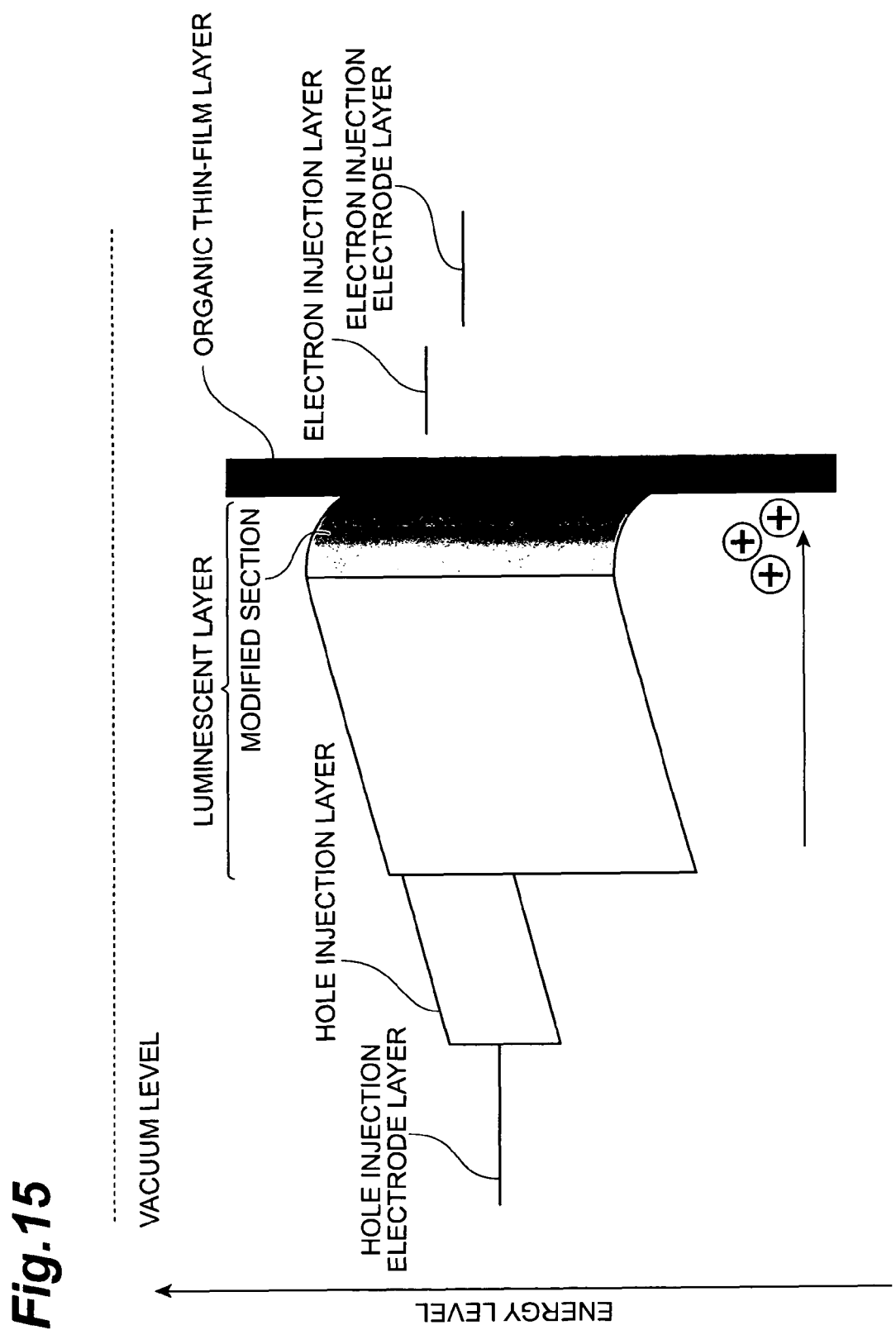
FIG. 15 is a schematic drawing showing an element structure and energy diagram for an organic EL element according to an eleventh embodiment.
Figure 16:
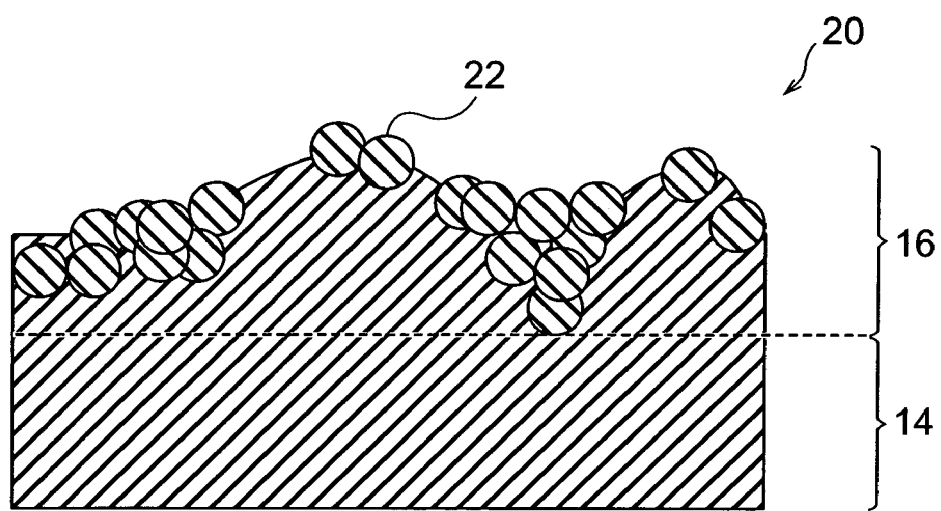
FIG. 16 is a cross-sectional view schematically showing the area near the surface of the luminescent layer 20.

FIG. 15 is a schematic drawing showing an element structure and energy diagram for an organic EL element according to an eleventh embodiment. Presumably, as shown in FIG. 15, an energy barrier is formed near the modified section and/or organic thin-film layer, and these regions function as blocking layers against holes. Migration of holes from the luminescent layer toward the electron injection electrode layer can therefore be adequately inhibited, and the holes satisfactorily accumulate in the luminescent layer. The accumulation of holes effectively lowers the electron injection barrier of the surrounding sections (the energy barrier necessary for injection of electrons into the luminescent layer). It is thought that this makes it possible to achieve an injection balance between electrons and holes, so that the probability of recombination between holes and electrons in the luminescent layer increases and the organic EL element shown in FIG. 15 exhibits sufficiently high luminescent efficiency. Presumably, since the thin-film layer and/or modified section can be made by polar organic polymer compound, adhesion to the electron injection layer, which is composed of a polar metal compound, is improved and long usable life is achieved. In addition, since direct contact between the luminescent layer and the metal electron injection electrode layer (cathode) is prevented, it is possible to prevent inactivation of the excited state caused by energy migration.

The organic EL element of the invention exhibits adequately high luminescent efficiency and a long usable life even while using a luminescent polymer compound as a structural material of the luminescent layer, mainly due to the features of being provided with the modified section 16 and/or the organic thin-film layer 30. In addition, generation of dark spots and short usable life that can be attributed to easy peeling off from the luminescent layer, which are problems when using between the luminescent layer and the cathode an inorganic oxide with an energy gap of 4.0 eV, are inhibited to a satisfactory level.

(Substrate)

The substrate 10 may be an amorphous substrate (for example, glass, quartz, etc.) or a crystalline substrate (for example, Si, GaAs, ZnSe, ZnS, GaP, InP, etc.), while there may also be used a substrate in which a crystalline, amorphous or metal buffer layer is formed on a crystalline substrate. As metal substrates, there may be used Mo, Al, Pt, Ir, Au, Pd or the like. There may also be used resin film substrates (for example, polyethylene terephthalate, etc.).

When the substrate 10 is on the light emerging side, it is preferred to use a transparent substrate such as glass or quartz, and particularly an inexpensive glass transparent substrate is preferably used. The transparent substrate may be provided with a color filter film, a fluorescent substance-containing color-converting film, a dielectric reflecting film or the like, for adjustment of the colored light.

(Hole Injection Electrode Layer)

The material used for the hole injection electrode (anode) layer, which is the first electrode layer, is preferably one which allows efficient injection of holes into the luminescent layer, and is preferably a substance with a work function of 4.5-5.5 eV. Specifically, it is preferably one composed mainly of tin-doped indium oxide (ITO), zinc-doped indium oxide (IZO), indium oxide ($In_2O_3$), tin oxide ($SnO_2$) or zinc oxide (ZnO), which are transparent conductive films.

These oxides may vary slightly from stoichiometric composition. The mixing ratio of $SnO_2$ with respect to $In_2O_3$ in ITO is preferably 1-20 wt %, and more preferably 5-12 wt %. The mixing ratio of ZnO with respect to $In_2O_3$ in IZO is usually about 12-32 wt %. The hole injection electrode layer 12 may also contain silica ($SiO_2$) for adjustment of the work function. The $SiO_2$ content is preferably about 0.5-10 mole percent with respect to ITO. Inclusion of $SiO_2$ will increase the work function of the ITO.

The electrode layer on the light emerging side is not limited to being a hole injection electrode layer. Also, the transmittance at 400-700 nm, which is the luminescent wavelength range of the organic EL element, and particularly the transmittance in the wavelength of each RGB color, is preferably 50% or greater, more preferably 80% or greater and even more preferably 90% or greater. If the light transmittance is less than 50%, the luminescence from the luminescent layer will be attenuated, tending to impair the brightness required for a luminescent element.

The film thickness of the hole injection electrode layer 12 is preferably selected based on the aforementioned light transmittance, when it is serving as the electrode layer on the light emerging side. For example, when an oxide transparent conductive film is used, the film thickness is preferably 50-500 nm, and more preferably 50-300 nm. If the film thickness of the hole injection electrode layer 12 is greater than 500 nm, the light transmittance will be insufficient and the hole injection electrode layer 12 will tend to peel from the substrate 10. While the light transmittance is improved with the decrease in film thickness, a film thickness of less than 50 nm will lower the efficiency of hole injection into the luminescent layer 20 and reduce the strength of the film.

(Electron Injection Electrode Layer)

The material used for the electron injection electrode (cathode) layer 18, which is the second electrode layer, is not particularly restricted, since it is not necessary to have a relatively low work function due to the effect of the modified section 16 of the luminescent layer 20, or the effect of the organic thin-film layer 30. Consequently, there may be used metals which have relatively low work functions, for example, alkali metals such as Li, Na, K or Cs, alkaline earth metals such as Mg, Ca, Sr or Ba, alkali halides such as LiF or CsI, oxides such as $Li_2O$, or metals having properties similar to those of alkali metals or alkaline earth metals, such as La, Ce, Sn, Zn or Zr, while there may also be used metals which have relatively high work functions, such as Al, Ag, In, Ti, Cu, Au, Mo, W, Pt, Pd or Ni, alloys of these metals, or alloys of these metals with other metals. Any one of these may be used alone, or two or more thereof may be used in combination.

Among these metals, LiF is preferably used for the electron injection electrode layer 18 so that the luminescent layer 20 can effectively exhibit its function. Conventionally, when LiF is used as the electron injection electrode layer of an organic EL element employing a luminescent polymer compound in the luminescent layer, it has been difficult to achieve adequate luminescent efficiency and long usable life. However, since the organic EL element of the invention is provided with the modified section 16 in the luminescent layer 20, or with the organic thin-film layer 30, the electron injection barrier can be substantially lowered, adhesion to LiF can be improved, and therefore it is possible to achieve excellent luminescent efficiency and long usable life, even when using LiF in the electron injection electrode layer 18.

The film thickness of the electron injection electrode layer 18 is not particularly restricted so long as it permits injection of electrons into the luminescent layer 20, but when an alkali metal or alkaline earth metal is used, the thickness is preferably 0.1-100 nm, and more preferably 1.0-50 nm. When an alkali halide or an oxide such as $Li_2O$ is used, the thickness is preferably as small as possible from the standpoint of the efficiency of electron injection into the luminescent layer 20, and specifically, it is preferably no larger than 10 nm and more preferably no larger than 5 nm.

(Luminescent Layer)

As explained above, the luminescent layer 20 may have a modified section 16 which comprises an organic polymer compound different from the organic compound of the non-modified luminescent layer 14, in bias toward the electron injection electrode layer side (that is, near the interface on the second electrode layer 18 side).

If the polymer compound contained in the modified section 16 has a relatively high insulating property, the luminescent efficiency of the organic EL element will be improved and the usable life lengthened. Therefore, it is preferably an organic polymer compound satisfying inequalities (1) and (2) above, or an organic polymer compound with an energy gap of 3.5 eV or greater (especially 4.0 eV or greater). The polymer compound contained in the modified section 16 is most preferably an organic polymer compound which satisfies inequalities (1) and (2) above and has an energy gap of 3.5 eV or greater (especially 4.0 eV or greater).

While the correlating factors between the insulating property and the luminescent efficiency enhancement and usable life lengthening are not thoroughly understood, it is surmised that a modified section containing a substance with a high insulating property functions effectively and reliably as a blocking layer against holes. More specifically, it is believed that accumulation of holes in the modified section 16 can effectively lower the electron injection barrier from the electron injection electrode layer. This phenomenon, together with the aforementioned accumulation of holes, can produce a suitable balance between holes and electrons without excess injection of holes or excess injection of electrons in the luminescent layer, thereby increasing the recombination probability between holes and electrons in the luminescent layer, improving the luminescent efficiency and lengthening the usable life.

As organic polymer compounds contained in the modified section 16, there may be mentioned polymers with polar groups, including copolymers of these polymers with polar or nonpolar polymers, or polar or nonpolar polymers having polar substituents on the end groups.

As specific examples of polar polymers, there may be mentioned polymers of unsaturated alcohols or unsaturated ethers, such as polyvinyl alcohol, polyallyl alcohol, polyvinyl ether or polyallyl ether, or copolymers of unsaturated alcohols and unsaturated ethers; polyethers; cellulose derivatives; polymers or copolymers of unsaturated carboxylic acids such as acrylic acid or methacrylic acid; polymers or copolymers of compounds having unsaturated bonds in alcohol residues, e.g. polyvinyl esters such as polyvinyl acetate, or polyacrylic esters of polyphthalic acid or the like; polymers or copolymers of compounds having unsaturated bonds in acid residues or in acid residues and alcohol residues, such as polyacrylic acid esters, polymethacrylic acid esters, maleic acid ester polymers and fumaric acid ester polymers; acrylonitrile polymers, methacrylonitrile polymers, acrylonitrile and methacrylonitrile copolymers, polyvinylidene cyanide, malononitrile polymers, fumaronitrile polymers, and malononitrile and fumaronitrile copolymers; polymers or copolymers of heterocyclic compounds, such as polyvinylpyridine, poly-N-vinylpyrrolidine and poly-N-vinylpyrrolidone; polymethyl methacrylate (PMMA).

Preferably used among these are, from the standpoint of further increasing the luminescent efficiency and usable life of the organic EL element, poly(2-vinylpyridine), poly(4-vinylpyridine), polyacrylic acid, polymethacrylic acid, poly(N,N-dimethylacrylamide), polyethylene glycol, polypropylene glycol, poly(2-ethyl-2-oxazoline), poly(2-hydroxyethyl acrylate), poly(2-hydroxyethyl methacrylate), poly(tetramethylene ether) glycol, polyvinyl acetate, polyvinylbutyral, substituted polystyrene and poly-N-vinylpyrrolidone.

The weight-average molecular weight (Mw) of the organic polymer compound different from the organic compound of the non-modified luminescent layer 14 is preferably 2000 or greater in order to allow suitable formation of the concentration gradient described hereunder. If the Mw is less than 2000, the luminescent efficiency of the organic EL element will tend to be reduced, and the usable life will tend to be shortened. This is presumably because of the reduced film quality, which can lead to aggregation and the like, and therefore can prevent suitable functioning of the modified section 16 as a blocking layer against holes.

The modified section 16 of the luminescent layer 20 is preferably formed by coating a solution containing an organic polymer compound different from the organic compound of the non-modified luminescent layer 14. By forming the modified section 16 in this manner, the luminescent efficiency and usable life of the organic EL element can be further improved. While the reason for this is not completely understood, it is attributed to the concentration gradient in the modified section 16. Specifically, it is assumed that the electron injection electrode layer side of the modified section 16 has a high proportion (concentration) of the coated organic polymer compound, and therefore a lower concentration of the substance composing the non-modified luminescent layer 14. Furthermore, it is thought that the concentration of the coated organic polymer compound gradually decreases, while the concentration of the substance composing the non-modified luminescent layer 14 increases, toward the hole injection electrode layer 12 side of the modified section 16. It is conjectured that by providing such a concentration gradient, the modified section 16 has a film thickness range of a certain size and is able to effectively function as a graded blocking layer against holes, thereby effectively contributing to recombination of the holes and electrons in the luminescent layer.

The solvent used in the aforementioned solution is not particularly restricted so long as it can dissolve the organic polymer compound described above. The solvent is preferably a polar solvent, from the viewpoint of coatability, solubility and the like.

As examples of such polar solvents, there may be mentioned N,N-dimethylacetamide and 2-ethoxyethanol, among which 2-ethoxyethanol is preferred.

The film thickness of the modified section is preferably 0.01-20 nm, more preferably 0.01-10 nm and even more preferably 0.01-5 nm. The thickness may be adjusted by appropriate control of the conditions during formation of the modified section 16. For example, when the modified section 16 is formed by coating as explained above, the thickness may be adjusted by controlling the concentration of the organic polymer compound in the coating solution, the coating time or the amount of coating solution used. The method for accomplishing such coating (coating method) is not particularly restricted, and for example, spin coating, spray coating, dip coating, ink-jet coating or printing may be suitably used.

The organic compound composing the non-modified luminescent layer 14 is not particularly restricted so long as it is a material (luminescent material) used to form luminescent layers in conventional organic EL elements.

The luminescent material used in the non-modified luminescent layer 14 may be, for example, a low molecular luminescent material (luminescent low molecular compound) such as an organic metal complex or fluorescent pigment, or a high molecular luminescent material (luminescent polymer compound) such as a n-conjugated polymer compound or molecular dispersing polymer compound (a polymer compound having a structure with a fluorescent pigment dispersed in a non-conjugated polymer compound). Alternatively, there may be used a combination of two or more different luminescent materials, for example, a mixture of a relatively low luminescent material used as the host material and a relatively high luminescent material used as the dopant material (guest material).

Using a high molecular luminescent material (luminescent polymer compound) as the luminescent material will increase the physical strength against top layer coating, enhance adhesion of the non-luminescent polymer compound with the luminescent layer 20, and improve the luminescent efficiency and usable life of the organic EL element.

When such a luminescent polymer compound is coated as a solution, fine irregularities are produced in the surface, thereby increasing the surface area. Thus, if an organic polymer compound different from the organic compound composing the non-modified luminescent layer 14 is coated as a solution on the surface having such fine irregularities, the adhesive area will be increased and the adhesive strength between the luminescent polymer compound and the modified section will be drastically improved. In addition, since the component of the modified section will be able to penetrate into the luminescent polymer compound to allow intermingling of molecules at the interface, the adhesive strength at the interface will be improved and a concentration gradient will also be created for the component of the modified section. These are believed to be the major factors responsible for the increased luminescent efficiency and usable life of the organic EL element.

From the standpoint of further improving the luminescent efficiency, heat resistance and usable life, it is more preferred to use a molecular dispersing polymer compound as the luminescent material of the luminescent layer 20, among the luminescent polymer compounds mentioned above, and it is even more preferred to use at least one polymer compound selected from the group consisting of vinyl-based polymer compounds obtained by polymerization of polymerizable monomers containing vinyl monomers derived from compounds having the structures represented by general formulas (1) to (4) below, vinyl-based polymer compounds obtained by polymerization of polymerizable monomers containing compounds represented by general formulas (5) to (10) below, and polymer compounds having repeating units represented by formulas (11) to (13) below, because this will improve the stability of the carrier transport property, heat resistance and luminescent efficiency.

The vinyl monomers derived from compounds having the structures represented by general formulas (1) to (4) below are more preferably vinyl monomers having structures represented by general formulas (14) to (16) and (18) below, respectively, and the compounds represented by general formulas (5), (9) and (10) are more preferably compounds represented by general formulas (21), (22) and (23) below, respectively.

Also, the vinyl monomers having the structure represented by general formula (16) below are more preferably vinyl monomers having the structure represented by general formula (17) below, and most preferably, at least one from among $X^{61}$-$X^{73}$ in general formula (17) is a substituent having an alkyl group with a total of 3-20 carbon atoms. There may also be suitably used vinyl monomers having the structure represented by general formula (19) below, and vinyl monomers having the structure represented by general formula (20) below.

In addition, the vinyl monomers represented by general formula (23) are preferably vinyl monomers represented by general formula (24) or (25) below. Using such preferred monomers as mentioned above can further increase the luminescent efficiency, heat resistance and usable life.

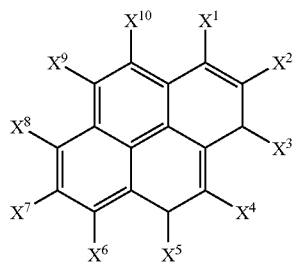
(1)

In formula (1), $X^1$-$X^{10}$ may be the same or different, and each represents hydrogen, alkyl, alkoxy, aryl, aryloxy, a heterocyclic group, amino, cyano or a halogen atom. The substituents bonded to the carbon atoms of the pyrene ring in formula (1) may also bond together to form rings.

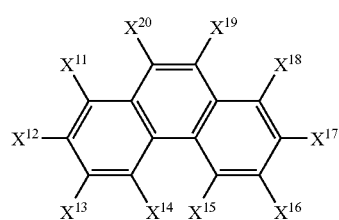
(2)

In formula (2), $X^{11}$-$X^{20}$ may be the same or different, and each represents hydrogen, alkyl, alkoxy, aryl, aryloxy, a heterocyclic group, amino, cyano or a halogen atom. The substituents bonded to the carbon atoms of the phenanthrene ring in formula (2) may also bond together to form rings.

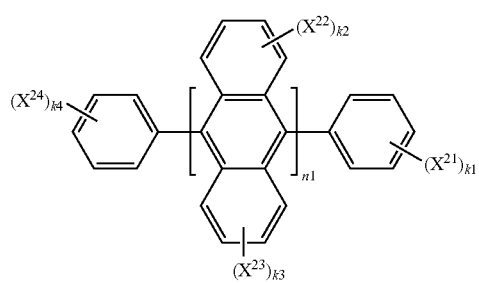
(3)

In formula (3), $X^{21}$-$X^{24}$ may be the same or different, and each represents a substituent (hydrogen, alkyl, alkoxy, aryl, aryloxy, a heterocyclic group, amino, cyano, a halogen atom, etc.), n1 represents an integer of 1-3, k1 and k4 represent integers of 0-5, and k2 and k3 represent integers of 0-4.

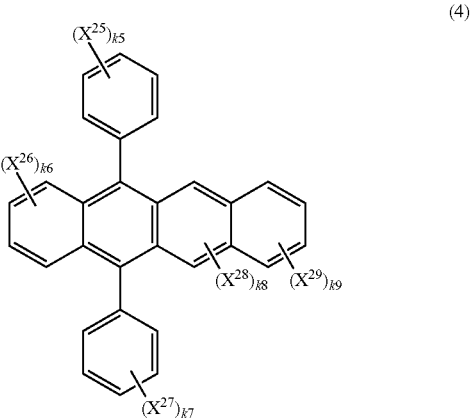
(4)

In formula (4), $X^{25}$-$X^{29}$ may be the same or different, and each represents alkyl, alkoxy, aryl, aryloxy, a heterocyclic group, amino, a halogen atom, or cyano. k5-k9 represent the number of substituents on the corresponding benzene ring, with k5 and k7 representing integers of 0-5, k6 and k9 representing integers of 0-4, and k8 representing an integer of 0-2. Also, the substituents bonded to the carbon atoms of the diphenylnaphthacene ring in formula (4) may bond together to form rings.

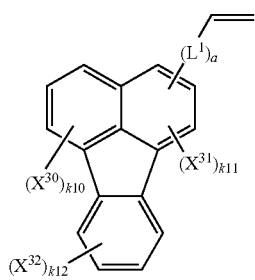
(5)

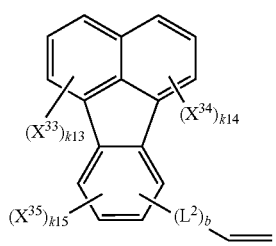
(6)

In formulas (5) and (6), $L^1$ and $L^2$ each represent a divalent group, $X^{30}$-$X^{35}$ may be the same or different and each represents alkyl, alkoxy, aryl, aryloxy, a heterocyclic group, amino, a halogen atom or cyano, a and b each represent 0 or 1, k10, k13, k14 and k15 represent integers of 0-3, k11 represents an integer of 0-2, and k12 represents an integer of 0-4.

Also, the substituents bonded to the carbon atoms of the fluoranthene ring may bond together to form rings.

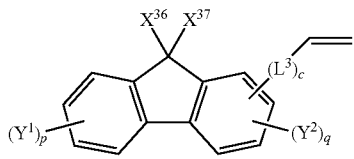
(7)

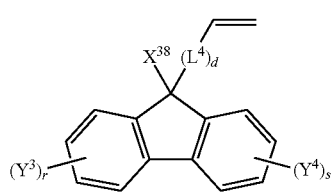
(8)

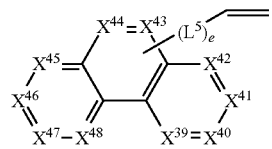
(9)

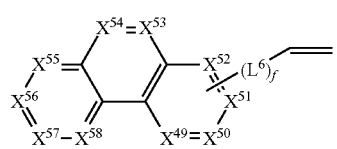
(10)

In formulas (7) and (8), $L^3$ and $L^4$ each represent a divalent group, $X^{36}$-$X^{38}$ may be the same or different and each represents hydrogen or a substituent, $Y^1$-$Y^4$ may be the same or different and each represents a substituent, c and d each represent 0 or 1, p, r and s represent integers of 0-4, q represents an integer of 0-3, and the substituents bonded to the carbon atoms of the fluorene ring may bond together to form rings.

In formulas (9) and (10), $L^5$ and $L^6$ each represent a divalent group, $X^{39}$-$X^{58}$ may be the same or different and each represents a carbon or nitrogen atom, e and f each represent 0 or 1, one from among $X^{39}$-$X^{48}$ is a carbon atom bonded to a group represented by $L^5$ or a vinyl group while the other carbon atoms may be bonded to substituents and the substituents may bond together to form rings, and one from among $X^{49}$-$X^{58}$ is a carbon atom bonded to a group represented by $L^6$ or a vinyl group while the other carbon atoms may be bonded to substituents and the substituents may bond together to form rings.

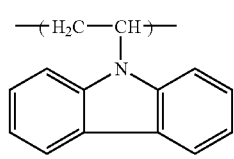
(11)

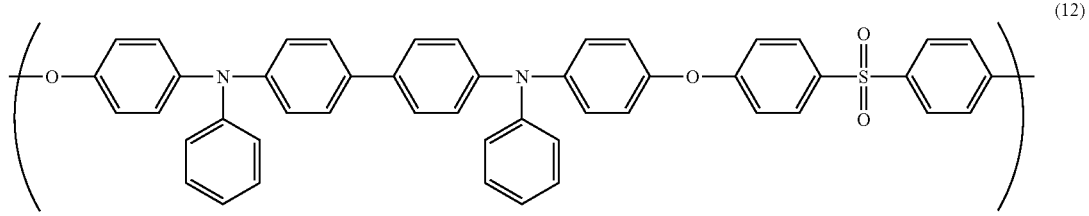
(12)

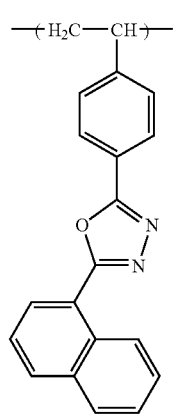
(13)

-continued

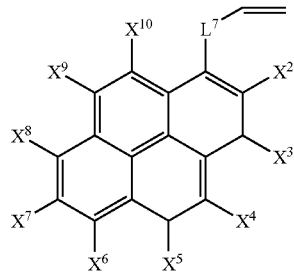

(14)

In formula (14), $L^7$ represents a single bond or a divalent group such as alkylene or arylene, where the divalent group may be substituted or unsubstituted, and $X^2$-$X^{10}$ may be the same or different and each represents hydrogen, alkyl, alkoxy, aryl, aryloxy, a heterocyclic group, amino, cyano or a halogen atom. The substituents bonded to the carbon atoms of the pyrene ring in formula (14) may bond together to form rings.

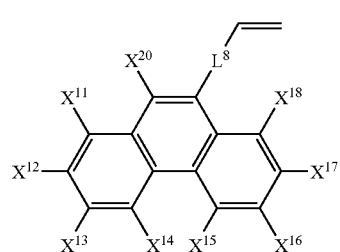

(15)

In formula (15), $L^8$ represents a single bond or a divalent group such as alkyl or aryl, where the divalent group may be substituted or unsubstituted, and $X^{11}$-$X^{20}$ may be the same or different and each represents hydrogen, alkyl, alkoxy, aryl, aryloxy, a heterocyclic group, amino, cyano or a halogen atom. The substituents bonded to the carbon atoms of the phenanthrene ring in formula (15) may bond together to form rings.

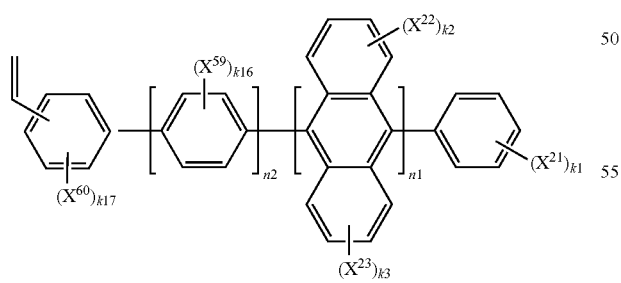

(16)

In formula (16), $X^{21}$-$X^{23}$, $X^{59}$ and $X^{60}$ may be the same or different and each represents alkyl, alkoxy, aryl, aryloxy, a heterocyclic group, a halogen atom, cyano, hydroxy or amino. n1 represents an integer of 1-3, n2 represents 0 or 1, k1 represents an integer of 0-5 and k2, k3, k16 and k17 represent integers of 0-4.

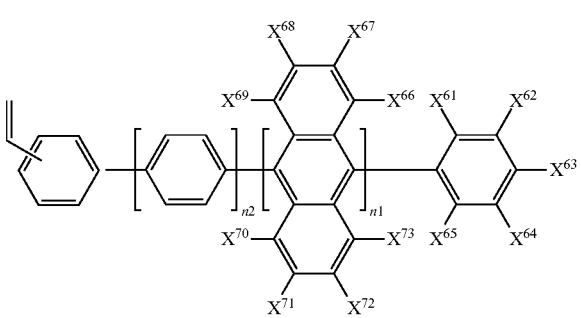

(17)

In formula (17), $X^{61}$-$X^{73}$ may be the same or different and each represents hydrogen, alkyl, alkoxy or aryl. n1 represents an integer of 1-3, and n2 represents 0 or 1.

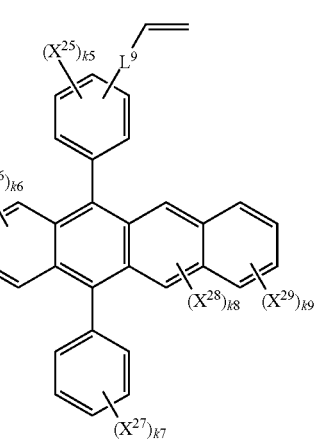

(18)

In formula (18), $L^9$ represents a single bond, or alkylene or arylene which may be substituted or unsubstituted, and $X^{25}$-$X^{29}$ may be the same or different and each represents alkyl, alkoxy, aryl, aryloxy, a heterocyclic group, amino, a halogen atom or cyano. k5-k9 represent the number of substituents on the corresponding benzene ring, with k5, k6 and k9 representing integers of 0-4, k7 representing an integer of 0-5, and k8 representing an integer of 0-2. Also, the substituents bonded to the carbon atoms of the diphenylnaphthacene ring in formula (18) may bond together to form rings.

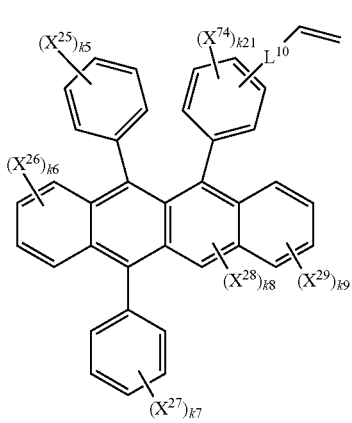
(19)

In formula (19), $L^{10}$ represents a single bond, or alkylene or arylene which may be substituted or unsubstituted, and $X^{25}$-$X^{29}$ and $X^{74}$ may be the same or different and each represents alkyl, alkoxy, aryl, aryloxy, a heterocyclic group, amino, a halogen atom or cyano. k5-k9 and k21 represent the number of substituents on the corresponding benzene ring, with k5 and k7 representing integers of 0-5, k6, k9 and k21 representing integers of 0-4, and k8 representing 0 or 1. Also, the substituents bonded to the carbon atoms of the diphenylnaphthacene ring in formula (19) may bond together to form rings.

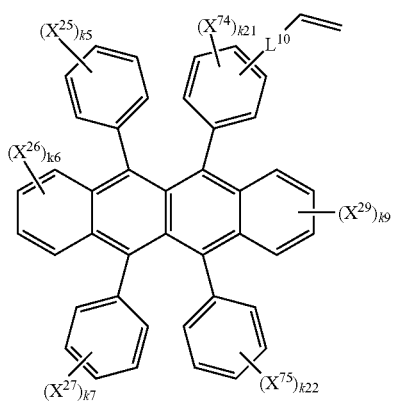
(20)

In formula (20), $L^{10}$ represents a single bond, or alkylene or arylene which may be substituted or unsubstituted, and $X^{25}$-$X^{27}$, $X^{29}$, $X^{74}$ and $X^{75}$ may be the same or different and each represents alkyl, alkoxy, aryl, aryloxy, a heterocyclic group, amino, a halogen atom or cyano. k5-k7, k9, k21 and k22 represent the number of substituents on the corresponding benzene ring, with k5, k7 and k22 representing integers of 0-5, and k6, k9 and k21 representing integers of 0-4. Also, the substituents bonded to the carbon atoms of the diphenylnaphthacene ring in formula (20) may bond together to form rings.

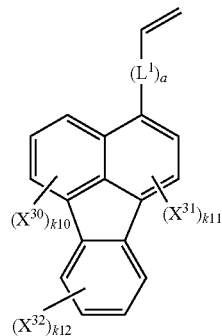
(21)

In formula (21), $L^1$ represents a divalent group, $X^{30}$-$X^{32}$ may be the same or different and each represents alkyl, alkoxy, aryl, aryloxy, a heterocyclic group, amino, a halogen atom or cyano, a represents 0 or 1, k10 represents an integer of 0-3, k11 represents an integer of 0-2, and k12 represents an integer of 0-4. Also, the substituents bonded to the carbon atoms of the fluoranthene ring in formula (21) may bond together to form rings.

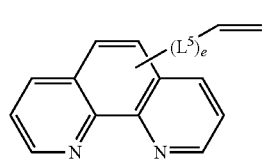
(22)

In formula (22), $L^5$ represents a divalent group, and e represents 0 or 1. Of the carbon atoms composing the phenanthroline ring in formula (22), substituents may be bonded to the carbon atoms other than those bonded to the group represented by $L^5$ or the vinyl group, and the substituents may bond together to form rings.

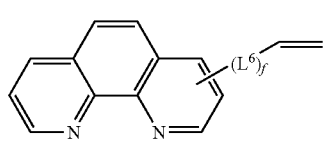
(23)

In formula (23), $L^6$ represents a divalent group, and f represents 0 or 1. Of the carbon atoms composing the phenanthroline ring in formula (23), substituents may be bonded to the carbon atoms other than those bonded to the group represented by $L^6$ or the vinyl group, and the substituents may bond together to form rings.

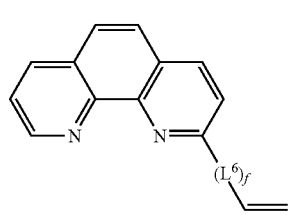
(24)

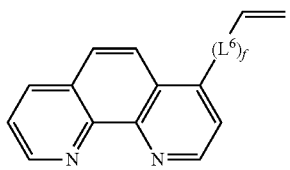

(25)

In formulas (24) and (25), $L^6$ represents a divalent group, and f represents 0 or 1. Of the carbon atoms composing the phenanthroline ring, substituents may be bonded to the carbon atoms other than those bonded to the group represented by $L^6$ or the vinyl group, and the substituents may bond together to form rings.

When a π-conjugated polymer compound is used, a polymer compound having a repeating unit represented by any of general formulas (26) to (29) below is preferred. Ar in general formula (29) represents a substituted or unsubstituted divalent aromatic group.

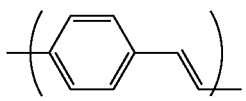

(26)

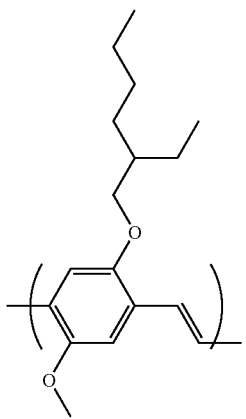

(27)

(28)

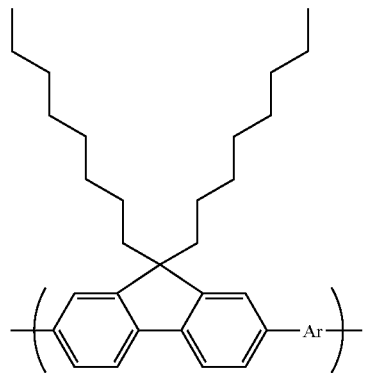

(29)

$L^1$-$L^{10}$ of the polymer compounds shown above are most preferably substituted or unsubstituted phenylene groups and a-f are most preferably 1, for the same reasons explained above.

In addition, there may be used as the luminescent material for the luminescent layer 20 a copolymer obtained by copolymerizing the repeating units of two or more different polymer compounds of the aforementioned polymer compounds used as luminescent materials for the luminescent layer 20, and there may also be used as the luminescent material a copolymer of the repeating unit of one or more of the aforementioned polymer compounds with the repeating unit of a polymer compound not mentioned here.

The luminescent polymer compound to be used in the luminescent layer 20 may also be a non-conjugated polymer compound. As such non-conjugated polymer compounds, there may be mentioned polymer compounds having in the main chain a structural unit represented by the following general formula (30).

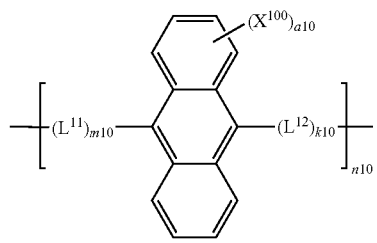

(30)

In general formula (30), $L^{11}$ and $L^{12}$ each represent a divalent organic group, and k10 and m10 represent 0 or 1, provided that (k10+m10) is 1 or greater. The divalent organic groups represented by $L^{11}$ and $L^{12}$ are not particularly restricted so long as they are organic groups which make the aforementioned polymer non-conjugated. That is, they may be divalent organic groups in which a single bond do not exist between two multiple bonds (with the proviso that aromatic rings may be contained in the organic group). As examples for $L^{11}$ and $L^{12}$, there may be mentioned substituted or unsubstituted alkylene groups, substituted or unsubstituted cycloalkylene groups, substituted or unsubstituted arylene groups, substituted or unsubstituted heterocyclic groups, oxy groups (oxygen atoms), carbonyl groups, imino groups, sulfonyl groups, or divalent organic groups comprising combinations of one or more of these groups.

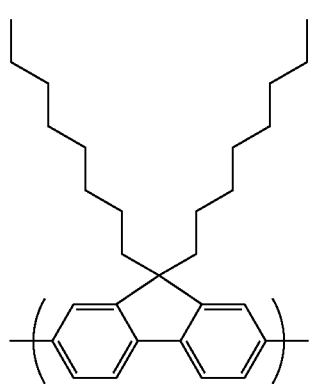

In general formula (30), $X^{100}$ represents alkyl, alkoxy, aryl, aryloxy, a heterocyclic group, a halogen atom, cyano, hydroxy or amino, and a10 represents an integer of 0-8. When a10 is an integer of 2-8, the $X^{100}$ groups substituting on the anthrylene group may be the same or different.

When $X^{100}$ is an alkyl group, the alkyl group may be straight-chain or branched. The alkyl group is preferably unsubstituted, but it may also be substituted. The number of carbon atoms of the alkyl group is preferably 1-30. As preferred alkyl groups, there may be mentioned methyl, ethyl, n-propyl, isopropyl, n-butyl, isobutyl, s-butyl, t-butyl and pentyl.

When $X^{100}$ is an alkoxy group, the alkyl portion of the alkoxy group may be straight-chain or branched. The alkoxy group is preferably unsubstituted, but it may also be substituted. The number of carbon atoms of the alkoxy group is preferably 1-30. As preferred alkoxy groups, there may be mentioned methoxy, ethoxy, n-propoxy, isopropoxy, n-butoxy, isobutoxy, s-butoxy and t-butoxy.

When $X^{100}$ is an aryl group, the aryl group may be substituted or unsubstituted, and the total number of carbon atoms of the aryl group is preferably 6-20. As preferred aryl groups, there may be mentioned phenyl, o-tolyl, m-tolyl, p-tolyl and biphenyl.

When $X^{100}$ is an aryloxy group, the aryl portion of the aryloxy group may be substituted or unsubstituted, and the total number of carbon atoms of the aryloxy group is preferably 6-20. As preferred aryloxy groups, there may be mentioned phenoxy, o-tolyloxy, m-tolyloxy and p-tolyloxy.

When $X^{100}$ is a heterocyclic group, the heterocyclic group is preferably a 5-membered cyclic group or 6-membered cyclic group. The heterocyclic group may have a fused ring, and it may have substituents. The heterocyclic group may be either aromatic or non-aromatic. As preferred heterocyclic groups, there may be mentioned pyrrolyl, pyridyl, quinolyl, thienyl and furyl.

When $X^{100}$ is a halogen atom, the halogen atom may be fluorine, chlorine, bromine or iodine.

When $X^{100}$ is an amino group, the amino group may be substituted or unsubstituted, and for example, it may have the aforementioned alkyl groups or aryl groups. The total number of carbon atoms of the amino group is preferably 0-20. As preferred amino groups, there may be mentioned amino itself (—NH$_2$), methylamino, ethylamino, phenylamino, dimethylamino and diphenylamino.

Also, n10 in general formula (30) represents an integer of 1 or greater, and it is preferably an integer such that the weight-average molecular weight of the non-conjugated polymer compound is in the range of 5000 to 1 million.

As the non-conjugated polymer compound, there is especially preferred a non-conjugated polymer compound having a structural unit represented by the following general formula (30a).

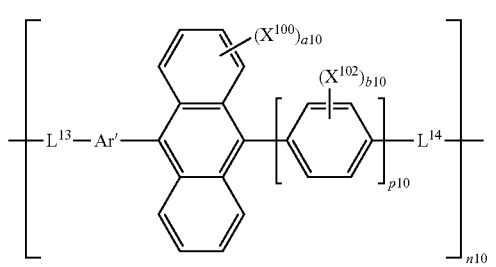

(30a)

In general formula (30a), $L^{13}$ and $L^{14}$ each represent a divalent organic group. $L^{13}$ and $L^{14}$ may be the same as $L^{11}$ and $L^{12}$ described above. Specifically, there may be used, for example, substituted or unsubstituted alkylene groups, substituted or unsubstituted cycloalkylene groups, substituted or unsubstituted arylene groups, substituted or unsubstituted heterocyclic groups, oxy groups (oxygen atoms), carbonyl groups, imino groups, sulfonyl groups, or divalent organic groups comprising combinations of one or more of these groups.

$X^{100}$, a10 and n10 have the same respective definitions as in general formula (30). Also, specific examples of $X^{102}$ include those mentioned for $X^{100}$ in general formula (30). p10 is an integer of 1 or greater, and is more preferably 1. b10 represents an integer of 0-4, and when b10 is an integer of 2-4, the $X^{102}$ groups substituting on the phenylene group may be the same or different.

Ar' represents a substituted or unsubstituted divalent aromatic group. Among such aromatic groups, substituted or unsubstituted phenylene, naphthylene or anthrylene, or combinations of these groups, are preferred, and aromatic groups represented by the following general formulas (31), (32), (33) or (34) are more preferred.

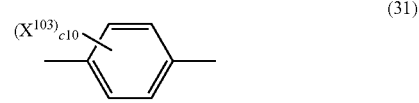

(31)

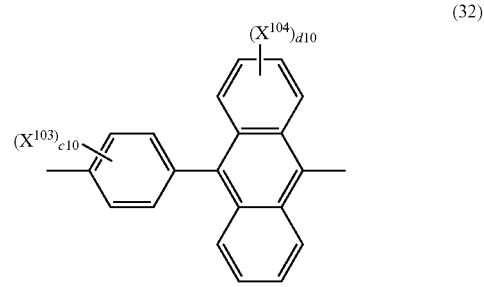

(32)

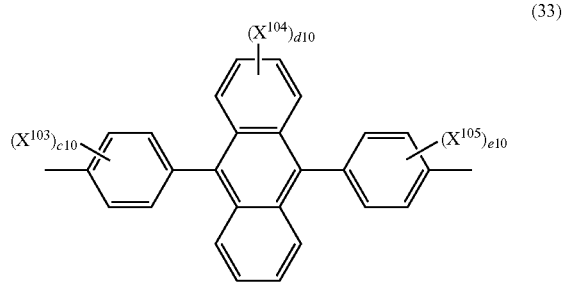

(33)

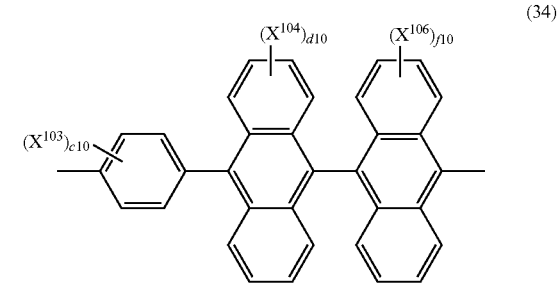

(34)

In general formulas (31), (32), (33) and (34), $X^{103}$, $X^{104}$, $X^{105}$ and $X^{106}$ each represents alkyl, alkoxy, aryl, aryloxy, a heterocyclic group, a halogen atom, cyano, hydroxy or amino, and specific examples include those mentioned for $X^{100}$ in general formula (30). Also, c10 and e10 represent integers of 0-4, and d10 and f10 represent integers of 0-8. When c10 and e10 are integers of 2-4, the $X^{103}$ or $X^{105}$ groups substituting on the phenylene groups may be the same or different. When d10 and f10 are integers of 2-8, the $X^{104}$ or $X^{106}$ groups substituting on the anthrylene groups may be the same or different.

Particularly preferred as the non-conjugated polymer compound is a non-conjugated polymer compound having a structural unit represented by the following general formulas (35), (36a) or (36b).

and substituted or unsubstituted arylene groups. q10 and r10 each represent 0 or 1, and when q10 is 0, the divalent hydrocarbon groups represented by $A^1$ are directly bonded together.

Ar', $X^{100}$, $X^{102}$, a10, b10, n10 and p10 have the same respective definitions as in general formula (2). Specifically, Ar represents a substituted or unsubstituted divalent aromatic group, $X^{100}$ and $X^{102}$ each represents alkyl, alkoxy, aryl, aryloxy, a heterocyclic group, a halogen atom, cyano, hydroxy or amino, a10 represents an integer of 0-8, b10 represents an integer of 0-4, and n10 and p10 represent integers of 1 or greater.

Examples of the group $-A^1-(L^{15})_{q10}-A^1-$ in general formula (3) include groups represented by any of the following formulas (37) to (41).

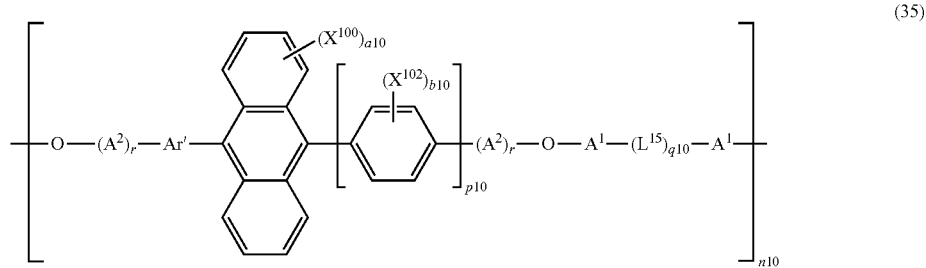

(35)

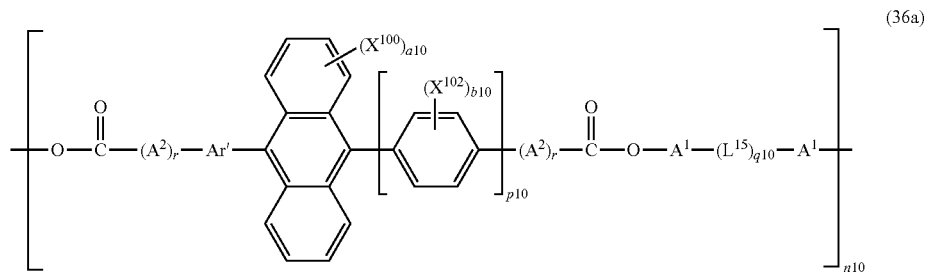

(36a)

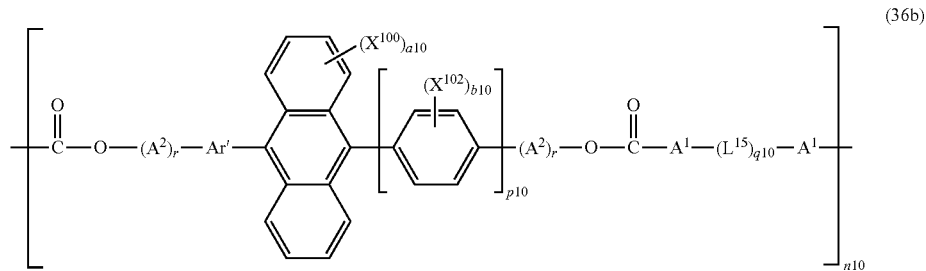

(36b)

In general formulas (35), (36a) and (36b), $L^{15}$ represents a divalent organic group composed of carbon atoms or hetero atoms. As specific examples of $L^{15}$, there may be mentioned substituted or unsubstituted alkylene groups, substituted or unsubstituted cycloalkylene groups, substituted or unsubstituted arylene groups, substituted or unsubstituted heterocyclic groups, oxy groups (oxygen atoms), carbonyl groups, imino groups and sulfonyl groups. $A^1$ and $A^2$ each represent a divalent hydrocarbon group, and as specific examples, there may be mentioned substituted or unsubstituted alkylene groups, substituted or unsubstituted cycloalkylene groups

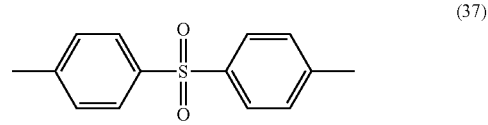

(37)

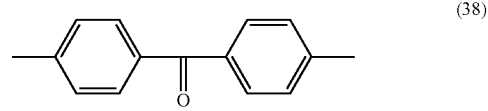

(38)

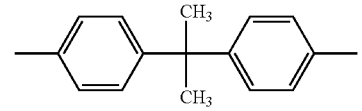 (39)

—CH$_2$—CH$_2$— (40)

—CH$_2$—CH$_2$—CH$_2$—CH$_2$— (41)

Examples of the group -A$^1$-(L$^{15}$)$_{q10}$-A$^1$- in general formulas (36a) and (36b) include ethylene represented by formula (40) above and n-butylene represented by formula (41) above, and examples of A$^2$ include methylene and ethylene.

As specific examples of the non-conjugated polymer compound represented by general formula (35), (36a) or (36b), there may be mentioned non-conjugated polymer compounds having structural units represented by the following formula (42) or (43), and the following formula (44), (45) or (46).

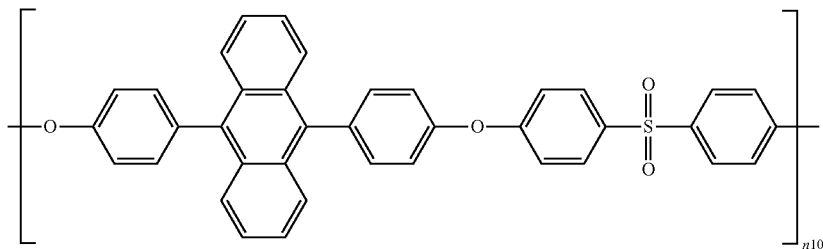 (42)

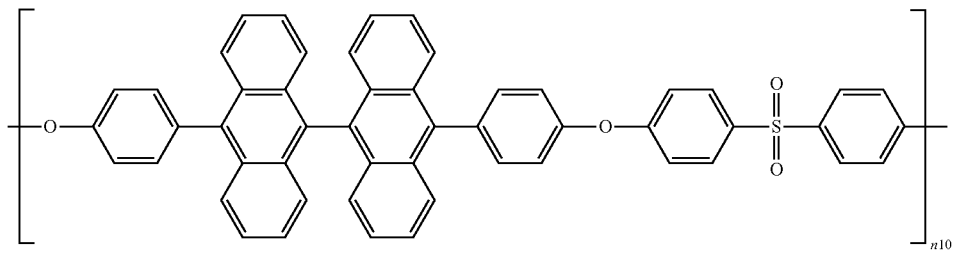 (43)

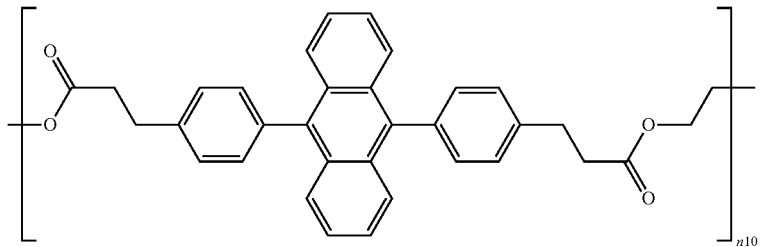 (44)

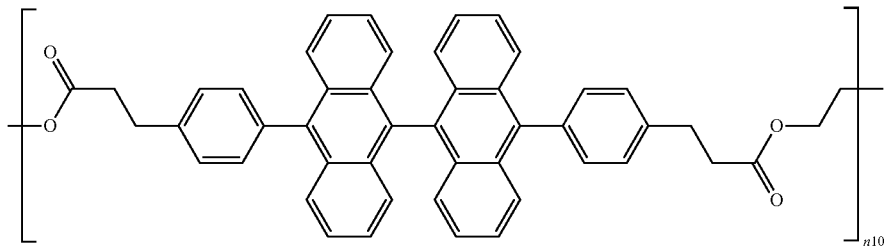 (45)

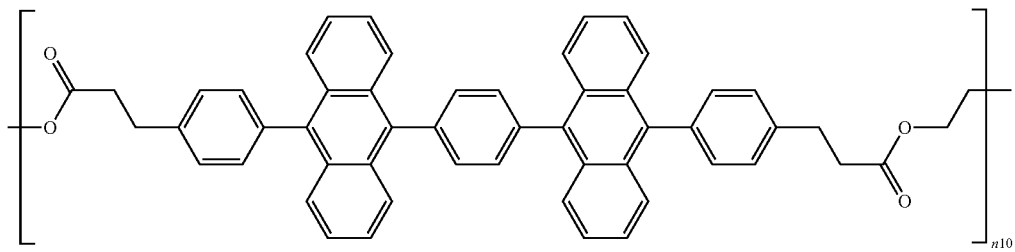 (46)

As examples of the low molecular luminescent material mentioned above, there may be mentioned naphthalene derivatives, anthracene and its derivatives, perylene and its derivatives, polymethyne-based, xanthene-based, coumarin-based and cyanine-based pigments, organic metal complexes of 8-hydroxyquinoline and its derivatives, aromatic amines, tetraphenylcyclopentadiene and its derivatives, and tetraphenylbutadiene and its derivatives. Specifically, there may be used publicly known materials such as described in Japanese Patent Application Laid-Open No. 57-51781 and No. 59-194393.

In addition to the luminescent material, the luminescent layer 20 may contain, if necessary, conventionally known carrier transport materials such as hole transport materials and/or electron transport materials.

As hole transport materials, there may be mentioned pyrazoline derivatives, arylamine derivatives, stilbene derivatives and triphenyldiamine derivatives.

As electron transport materials, there may be used organic metal complexes of oxadiazole derivatives, anthraquinodimethane or its derivatives, benzoquinone or its derivatives, naphthoquinone or its derivatives, anthraquinone or its derivatives, tetracyanoanthraquinodimethane or its derivatives, fluorene or its derivatives, diphenyldicyanoethylene or its derivatives, diphenoquinone derivatives, and 8-hydroxyquinoline or its derivatives.

The amount of carrier transport material used will differ depending on the type of compound used, etc., and therefore the appropriate amount of addition may be determined in a range which does not inhibit adequate film forming properties and luminescent characteristics. The amount will ordinarily be 1-40 wt %, and more preferably 2-30 wt %, with respect to the luminescent material.

The film thickness of the luminescent layer 20 is not particularly restricted and will differ depending on the forming method, but from the standpoint of further enhanced luminescent efficiency, it is preferably 20-150 nm.

(Organic Thin-Film Layer)

The organic thin-film layer is composed of an organic polymer compound satisfying inequalities (1) and (2) above, or an organic polymer compound with an energy gap of 3.5 eV or greater (especially 4.0 eV or greater). The organic thin-film layer is most preferably composed of an organic polymer compound which satisfies inequalities (1) and (2) above, and has an energy gap of 3.5 eV or greater (especially 4.0 eV or greater). Examples of organic polymer compounds composing the organic thin-film layer include the same compounds used for the modified section 16 mentioned above. Specifically, there may be mentioned polymers with polar groups, copolymers of these polymers with polar or nonpolar polymers, or polar or nonpolar polymers having polar substituents on the end groups. When an organic EL element is provided with an organic thin-film layer and a modified section, and both contain an organic polymer compound with an energy gap of 4.0 eV or greater, the organic polymer compounds in the organic thin-film layer and the modified section may be either the same or different, but are preferably the same from the standpoint of facilitating fabrication.

As specific examples of polar polymers used for the organic thin-film layer, there may be mentioned polymers of unsaturated alcohols or unsaturated ethers, such as polyvinyl alcohol, polyallyl alcohol, polyvinyl ether or polyallyl ether, or copolymers of unsaturated alcohols and unsaturated ethers; polyethers; cellulose derivatives; polymers or copolymers of unsaturated carboxylic acids such as acrylic acid or methacrylic acid; polymers or copolymers of compounds having unsaturated bonds in alcohol residues, e.g. polyvinyl esters such as polyvinyl acetate, or polyacrylic esters of polyphthalic acid or the like; polymers or copolymers of compounds having unsaturated bonds in acid residues or in acid residues and alcohol residues, such as polyacrylic acid esters, polymethacrylic acid esters, maleic acid ester polymers and fumaric acid ester polymers; acrylonitrile polymers, methacrylonitrile polymers, acrylonitrile and methacrylonitrile copolymers, polyvinylidene cyanide, malononitrile polymers, fumaronitrile polymers, and malononitrile and fumaronitrile copolymers; polymers or copolymers of heterocyclic compounds, such as polyvinylpyridine, poly-N-vinylpyrrolidine and poly-N-vinylpyrrolidone; polymethyl methacrylate (PMMA).

A preferred embodiment of an organic EL element according to the invention was described above, but the invention is not limited in any way to this embodiment.

According to another embodiment of an organic EL element of the invention, the first electrode layer is an electron injection electrode (cathode) layer, and the second electrode layer is a hole injection electrode layer. If the electron injection electrode (cathode) layer is situated on the substrate, the electron injection electrode layer side can serve as the light emerging side. In this case, the electron injection electrode layer preferably satisfies the same optical conditions and film thickness conditions as when the hole injection electrode layer side is the light emerging side.

Also, a plurality of luminescent layers may be laminated as the organic layer, and a hole injection layer, hole transport layer and/or electron transport layer may be laminated in addition to the luminescent layer. In this case, as explained above, a hole injection layer may be laminated adjacent to the luminescent layer side of the hole injection electrode layer, a hole transport layer may be laminated between the hole injection layer and the luminescent layer, and an electron transport layer may be laminated between the electron injection electrode layer and the luminescent layer.

The hole transport material used for the hole transport layer and the electron transport material used for the electron transport layer may be the same materials mentioned above. The hole injection material used for the hole injection layer may be a publicly known conductive polymer compound such as polythiophene or polyaniline.

The film thickness for formation of the organic layer by a coating method is preferably 0.5-1000 nm and more preferably 10-500 nm, per organic layer. By increasing the film thickness of the organic layer, especially to 20 nm or greater, it is possible to prevent generation of leakage current.

According to another embodiment of an organic EL element of the invention, the modified section of the luminescent layer may contain an organic metal salt such as BAlq, either instead of or in addition to the aforementioned organic polymer compound. Here, an organic metal salt is an organic acid, alcohol or dialkylamide having one hydrogen replaced with a metal, with some, but not all, of the bonds being coordination bonds between the metal and ligand. As organic metal salts, there may be mentioned salts of organic acids such as carboxylic acids, or salts of phenols, alkoxides, dialkylamides, and the like.

A carboxylic acid used may be aliphatic or aromatic. An aliphatic carboxylic acid used preferably has a total of 1-24 carbon atoms and may be a saturated aliphatic carboxylic acid or an unsaturated aliphatic carboxylic acid, and may even have two or more carboxyl groups. It may also have aryl groups or the like as substituents. Specifically, there may be mentioned aliphatic carboxylic acids such as acetic acid, propionic acid, octylic acid, isooctylic acid, decanoic acid or lauric acid, unsaturated aliphatic carboxylic acids such as oleic acid or ricinolic acid (ricinoleic acid), or polycarboxylic acids (e.g. di- or tri-carboxylic acids) such as citric acid, malic acid or oxalic acid. An aromatic carboxylic acid used preferably has a total of 7-24 carbon atoms and may have substituents ($C_{1-8}$ alkyl, hydroxy, etc.), and specifically, there may be mentioned benzoic acid, o-(t-butyl)benzoic acid, m-(t-butyl)benzoic acid, salicylic acid, m-(hydroxy)benzoic acid or p-(hydroxy)benzoic acid.

A phenol used preferably has a total of 6-46 carbon atoms, may have substituents ($C_{1-8}$ straight-chain or branched alkyl groups, or aryl groups such as phenyl) or fused rings (aromatic rings such as benzene rings which may be optionally substituted), and may be a monohydric phenol or polyhydric (dihydric or greater) phenol. Specifically, there may be mentioned phenol, naphthol, 4-phenylphenol or 2,2-bis(p-hydroxyphenyl)propane (bisphenol A).

An alcohol used to form an alkoxide preferably has a total of 1-10 carbon atoms, and there may be mentioned primary alcohols such as ethyl alcohol, n-propyl alcohol or n-butyl alcohol, secondary alcohols such as isopropyl alcohol or s-butyl alcohol, and tertiary alcohols such as t-butyl alcohol. The alcohol may be a polyhydric (dihydric or greater) alcohol such as ethylene glycol.

A dialkylamide used may have additional substituents and preferably has a total of 2-24 carbon atoms. Specifically, there may be mentioned dimethylamide, diethylamide and N-methyl-N-ethylamide.

Examples of preferred organic metal salts include alkoxide, phenoxide or acetic acid salts. The reason why such salts or complexes are preferred is that they are highly stable and has a high solubility in coating solvents.

The following compounds may be mentioned as specific examples of the aforementioned organic metal salt and organic metal complex. They may be used alone or in combination of two or more.

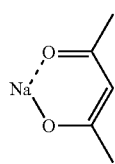

(C-1)

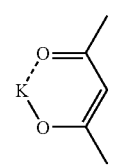

(C-2)

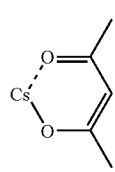

(C-3)

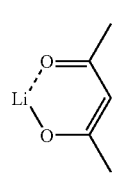

(C-4)

-continued

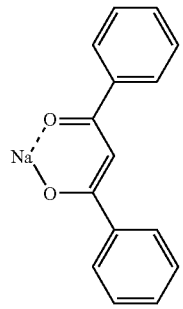

(C-5)

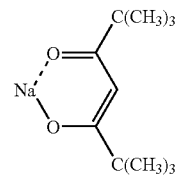

(C-6)

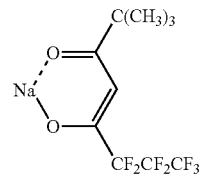

(C-7)

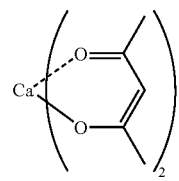

(C-8)

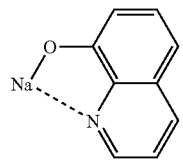

(C-9)

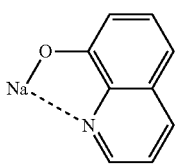

(C-10)

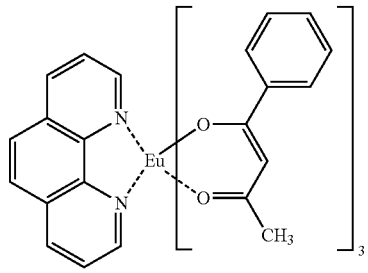

(C-11)

(C-18) and (C-22) compounds list with structures shown.

The compounds of formulas (C-18) and (C-22) have a weight-average molecular weight of preferably 5000-500000 and more preferably 20000-300000.

In order to prevent degradation of the organic layer or electrode of the element, it is preferred to seal the top of the element with a sealing plate or the like. The sealing plate is preferably adhesively sealed using an adhesive resin layer, in order to prevent infiltration of moisture. The sealing gas is preferably an inert gas such as Ar, He or $N_2$. The moisture content of the sealing gas is preferably no greater than 100 ppm by weight, more preferably no greater than 10 ppm by weight, and even more preferably no greater than 1 ppm by weight. There is no particular lower limit for the moisture content, but it will usually be about 0.1 ppm by weight.

A preferred embodiment of a fabrication process for an organic EL element of the invention will now be explained in detail. This fabrication process is for an organic EL element having the construction shown in FIG. 1.

First, a hole injection electrode layer 12 made of, for example, ITO or the like is formed on a prepared substrate 10. The forming method employed may be a conventionally used method such as sputtering or vapor deposition.

A luminescent layer 20 is then formed on the hole injection electrode layer 12. If the luminescent layer contains a high molecular luminescent material (luminescent polymer compound) and the luminescent material can be formed from a solution, the forming method used may be a coating method such as spin coating, spray coating, dip coating, ink-jet coating or printing. Spin coating is preferred among these methods, and coating onto the entire surface of the hole injection electrode layer 12 will greatly facilitate the step of forming the luminescent layer 20, simplifying, and lowering the cost of, the production apparatus required.

When the luminescent layer is composed of a low molecular luminescent material, sputtering or vapor deposition methods may be used instead of the aforementioned coating methods, but a coating method is still preferably used for formation of the modified section 16 in consideration of the adhesion and concentration gradient of the organic polymer compound, because it allows easier formation of irregularities on the surface of the luminescent layer.

Next, in order to form the modified section 16 near the surface of the luminescent layer 20, the surface of the luminescent layer 20 is coated with a solution which contains the aforementioned organic polymer compound and which is prepared using a solvent such as described above, preferably a polar solvent. The coating method is not particularly restricted, and for example, spin coating, spray coating, dip coating, ink-jet coating or printing may be employed.

Also, the concentration of the organic polymer compound in the solution is preferably adjusted to yield a modified section 16 with the desired thickness. The concentration is preferably 0.01-1.0 wt %. This numerical range is a very low concentration compared to the concentrations of solutions used for coated formation of organic layers containing polymer compounds for conventional organic EL elements, but coating of a solution having this level of concentration will tend to give a suitable concentration gradient to the modified section 16. Formation of an electron injection electrode layer 18 on the luminescent layer 20 completes the organic EL element. The method for this formation may be a conventionally employed method such as vapor deposition or sputtering.

An organic EL element having the construction shown in FIG. 7 may be fabricated by first forming the luminescent layer, coating this layer with a solution containing an organic polymer compound satisfying inequalities (1) and (2), or an organic polymer compound with an energy gap of 3.5 eV or greater, to form an organic thin-film layer 30, and then forming an electron injection electrode layer 18. An organic EL element having the construction shown in FIG. 11 may be fabricated by first forming the modified section 16 in the manner described above, coating it with a solution containing an organic polymer compound satisfying inequalities (1) and (2), or an organic polymer compound with an energy gap of 3.5 eV or greater, to form an organic thin-film layer 30, and then forming an electron injection electrode layer 18. The organic EL elements having the structures shown in FIGS. 4-6, 8-10 and 12-13 may be fabricated by applying publicly known formation methods for an electron injection layer 22 and/or hole injection layer 24 to the fabrication process described above. When the material of the organic thin-film layer 30 is the same as the material of the modified section 16, it is possible to simultaneously form the modified section 16 and the organic thin-film layer 30 by first forming the luminescent layer, and coating this layer with a solution comprising a solvent capable of dissolving or swelling the luminescent layer, and the organic polymer compound satisfying inequalities (1) and (2) or the organic polymer compound with an energy gap of 3.5 eV or greater.

A preferred embodiment of a fabrication process for an organic EL element according to the invention was described above, but the invention is not limited in any way to this embodiment.

According to another embodiment of a fabrication process for an organic EL element of the invention, for fabrication of an organic EL element having a plurality of laminated organic layers, the upper layer is coated after removing the solvent from the coated side of the lower layer in order to form an interface between the two organic layers. In this case, after coating the lower layer, it may be subjected to heat treatment or the like, if necessary.

When no interface is formed between the two organic layers, the boundary between the two layers can be formed to have a so-called graded composition. That is, by accomplishing the coating using materials having at least different solubilities in the solvent, different solvents, different viscosities or different specific gravities, it is possible to coat two different organic layers separately, and to modify the composition at the interface in a graded fashion. Also, formation of an interface can be avoided by coating the next layer before the solvent is completely removed from the coated side of the lower layer. In this case, the combination ratio of the main components, or dopant materials, of the two layers in the region of the interface between the two layers is preferably about 10000:1 to 1:1 and more preferably about 1000:1 to 10:1, in terms of weight ratio.

According to yet another embodiment, for fabrication of an organic EL element wherein the modified section contains the above-mentioned organic metal salt either instead of or in addition to the organic polymer compound, the modified section is preferably formed on the luminescent layer by coating the organic metal salt by a coating method. In this case as well, the concentration of the organic metal salt in the coated solution is more preferably appropriately adjusted to yield a modified section with the desired thickness.

EXAMPLES

The present invention will now be explained in greater detail through the following examples, with the understanding that these examples are in no way limitative on the invention.

Example 1

First, PEDOT/PSS (BAYTRON P, product of Bayer) was spin coated onto the ITO film of a transparent glass substrate having an ITO film with a sheet resistance of 15Ω/☐ as a hole injection electrode (anode) layer, to form a hole injection layer with a film thickness of 40 nm. Next, there were dissolved in toluene 95 wt % of a polymer compound (molecular weight: 20000) composed of the repeating unit represented by formula (47) shown below and 5 wt % of rubrene, to prepare a toluene solution with a 2 wt % concentration. The toluene solution was applied onto the hole injection layer by spin coating to form a luminescent layer with a film thickness of 70 nm.

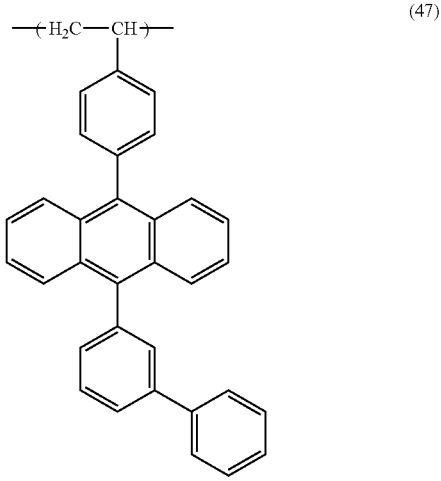

(47)

Poly(2-vinylpyridine) having a molecular weight of 300000, which is an organic polymer compound with an energy gap of 3.5 eV or greater, was then dissolved at 0.1 wt % in 2-ethoxyethanol to prepare a solution, which was then coated onto the luminescent layer by spin coating and dried for 1 hour at 180° C. in a $N_2$ atmosphere to form a organic thin-film layer and a modified section. The total film thickness of the organic thin-film layer and the modified section was 2 nm. Incidentally, $|EA_{LL}|-|EA_{OTL}|$ was 0.3 eV or greater, and $|IP_{OTL}|-|IP_{LL}|$ was 0.3 eV or greater.

Next, LiF was vapor deposited onto the modified section-formed luminescent layer to a film thickness of 0.2 nm, and Al was vapor deposited thereover to a film thickness of 250 nm to form an electron injection electrode (cathode) layer, thereby obtaining an organic EL element for Example 1.

When the characteristics of the organic EL element were measured, the brightness at a current density of 10 mA/cm$^2$ was 413 cd/m$^2$, and the driving voltage was 4.86 V. Upon constant current driving at this current density, the brightness half-life was 500 hours.

Example 2

An organic EL element for Example 2 was obtained in the same manner as in Example 1, except that polystyrene having a molecular weight of 150000 and acid chlorides at both terminal groups, which is an organic polymer compound with an energy gap of 3.5 eV or greater, was used instead of the poly(2-vinylpyridine) with a molecular weight of 300000. The total film thickness of the organic thin-film layer and the modified section was 2 nm. Incidentally, $|EA_{LL}|-|EA_{OTL}|$ was 0.3 eV or greater, and $|IP_{OTL}|-|IP_{LL}|$ was 0.3 eV or greater.

When the characteristics of the organic EL element were measured, the brightness at a current density of 10 mA/cm$^2$ was 273 cd/m$^2$, and the driving voltage was 5.20 V. Upon constant current driving at this current density, the brightness half-life was 300 hours.

Example 3

An organic EL element for Example 3 was obtained in the same manner as in Example 1, except that poly(2-vinylpyridine) with a molecular weight of 30000, which is an organic polymer compound with an energy gap of 3.5 eV or greater, was used instead of the poly(2-vinylpyridine) with a molecular weight of 300000. The total film thickness of the organic thin-film layer and the modified section was 2 nm. Incidentally, $|EA_{LL}|-|EA_{OTL}|$ was 0.3 eV or greater, and $|IP_{OTL}|-|IP_{LL}|$ was 0.3 eV or greater.

When the characteristics of the organic EL element were measured, the brightness at a current density of 10 mA/cm$^2$ was 400 cd/m$^2$, and the driving voltage was 5.00 V. Upon constant current driving at this current density, the brightness half-life was 80 hours.

Example 4

An organic EL element for Example 4 was obtained in the same manner as in Example 1, except that PMMA with a molecular weight of 200000, which is an organic polymer compound with an energy gap of 3.5 eV or greater, was used instead of the poly(2-vinylpyridine) with a molecular weight of 300000. The total film thickness of the organic thin-film layer and the modified section was 2 nm. Incidentally, $|EA_{LL}|-|EA_{OTL}|$ was 0.3 eV or greater, and $|IP_{OTL}|-|IP_{LL}|$ was 0.3 eV or greater.

When the characteristics of the organic EL element were measured, the brightness at a current density of 10 mA/cm$^2$ was 300 cd/m$^2$, and the driving voltage was 5.20 V. Upon constant current driving at this current density, the brightness half-life was 350 hours.

Example 5

An organic EL element for Example 5 was obtained in the same manner as in Example 1, except that MEH-PPV (molecular weight: 100000) was used to form a luminescent layer with a film thickness of 60 nm by spin coating, instead of the luminescent layer of Example 1. The total film thickness of the organic thin-film layer and the modified section was 2 nm. Incidentally, $|EA_{LL}|-|EA_{OTL}|$ was 0.3 eV or greater, and $|IP_{OTL}|-|IP_{LL}|$ was 0.3 eV or greater.

When the characteristics of the organic EL element were measured, the brightness at a current density of 10 mA/cm$^2$ was 600 cd/m$^2$, and the driving voltage was 3.50 V. Upon constant current driving at this current density, the brightness half-life was 250 hours.

Example 6

An organic EL element for Example 6 was obtained in the same manner as in Example 1, except that instead of preparing a solution by dissolving the poly(2-vinylpyridine) with a molecular weight of 300000 in 2-ethoxyethanol at 0.1 wt %, a solution was prepared by dissolving a mixture of 50 wt % of poly(2-vinylpyridine) with a molecular weight of 300000 and 50 wt % of Na(acac) represented by formula (C-1) above in 2-ethoxyethanol at 0.2 wt %, and that vapor deposition of Al was carried out to a film thickness of 250 nm, without vapor deposition of LiF, on the modified section-formed luminescent layer. The total film thickness of the organic thin-film layer and the modified section was 2 nm. Incidentally, $|EA_{LL}|-|EA_{OTL}|$ was 0.3 eV or greater, and $|IP_{OTL}|-|IP_{LL}|$ was 0.3 eV or greater.

When the characteristics of the organic EL element were measured, the brightness at a current density of 10 mA/cm$^2$ was 350 cd/m$^2$, and the driving voltage was 5.80 V. Upon constant current driving at this current density, the brightness half-life was 550 hours.

Example 7

An organic EL element for Example 7 was obtained in the same manner as in Example 1, except that instead of using a solution of the poly(2-vinylpyridine) with a molecular weight of 300000, there was used a solution prepared by dissolving polyethylene glycol with a molecular weight of 200000, which is an organic polymer compound with an energy gap of 3.5 eV or greater, in 0.1 wt % methanol. The total film thickness of the organic thin-film layer and the modified section was 2 nm. Incidentally, $|EA_{LL}|-|EA_{OTL}|$ was 0.3 eV or greater, and $|IP_{OTL}|-|IP_{LL}|$ was 0.3 eV or greater.

When the characteristics of the organic EL element were measured, the brightness at a current density of 10 mA/cm$^2$ was 400 cd/m$^2$, and the driving voltage was 5.20 V. Upon constant current driving at this current density, the brightness half-life was 450 hours.

Example 8

An organic EL element for Example 8 was obtained in the same manner as in Example 1, except that polyvinylpyrrolidone with a molecular weight of 130000, which is an organic polymer compound with an energy gap of 3.5 eV or greater, was used instead of the poly(2-vinylpyridine) with a molecular weight of 300000. The total film thickness of the organic thin-film layer and the modified section was 2 nm. Incidentally, $|EA_{LL}|-|EA_{OTL}|$ was 0.3 eV or greater, and $|IP_{OTL}|-|IP_{LL}|$ was 0.3 eV or greater.

When the characteristics of the organic EL element were measured, the brightness at a current density of 10 mA/cm$^2$ was 430 cd/m$^2$, and the driving voltage was 5.00 V. Upon constant current driving at this current density, the brightness half-life was 550 hours.

Example 9

An organic EL element for Example 9 was obtained in the same manner as in Example 1, except that LiF was not vapor deposited. The total film thickness of the organic thin-film layer and the modified section was 2 nm.

When the characteristics of the organic EL element were measured, the brightness at a current density of 10 mA/cm$^2$ was 130 cd/m$^2$, and the driving voltage was 6.00 V. Upon constant current driving at this current density, the brightness half-life was 150 hours.

Example 10

An organic EL element for Example 10 was obtained in the same manner as in Example 1, except that the total film thickness of the organic thin-film layer and the modified section was 0.2 nm. When the characteristics of the organic EL element were measured, the brightness at a current density of 10 mA/cm$^2$ was 150 cd/m$^2$, and the driving voltage was 8.5 V. The brightness half-life was 300 hours.

In Examples 1-10, organic thin-film layers composed of the same components as the modifying components were formed adjacent to the modified sections. The film thicknesses of such organic thin-film layers were less than 2 nm.

Reference Example 1

An organic EL element for Reference Example 1 was obtained in the same manner as in Example 1, except that the total film thickness of the organic thin-film layer and the modified section was 31 nm. When the characteristics of the organic EL element were measured, the brightness at a current density of 10 mA/cm$^2$ was 1 cd/m$^2$, and the driving voltage was 22 V. The brightness half-life was unmeasurable.

Comparative Example 1

An organic EL element for Comparative Example 1 was obtained in the same manner as in Example 1, except that the organic thin-film layer and modified section were not formed. When the characteristics of the organic EL element were measured, the brightness at a current density of 10 mA/cm$^2$ was 18 cd/m$^2$, and the driving voltage was 8.50 V. Upon constant current driving at this current density, the brightness half-life was 50 hours.

Comparative Example 2

An organic EL element for Comparative Example 2 was obtained in the same manner as in Comparative Example 1, except that MEH-PPV (molecular weight: 100000) was used to form a luminescent layer with a film thickness of 60 nm by spin coating, instead of the luminescent layer of Comparative Example 1.

When the characteristics of the organic EL element were measured, the brightness at a current density of 10 mA/cm$^2$ was 80 cd/m$^2$, and the driving voltage was 3.50 V. Upon constant current driving at this current density, the brightness half-life was 30 hours.

Comparative Example 3

An organic EL element for Comparative Example 3 was obtained in the same manner as in Comparative Example 1, except that a mixture of MEH-PPV (molecular weight: 100000) and polystyrene (molecular weight: 150000) (mixing ratio=50:50 by weight) was used to form a luminescent layer with a film thickness of 60 nm by spin coating, instead of the luminescent layer of Comparative Example 1.

When the characteristics of the organic EL element were measured, the brightness at a current density of 10 mA/cm$^2$ was 2 cd/m$^2$, and the driving voltage was 10 V. Upon constant current driving at this current density, the brightness half-life was too short to be measured.

Comparative Example 4

An organic EL element for Comparative Example 4 was obtained in the same manner as in Example 1, except that the organic thin-film layer and modified section were not formed, and BaO was vapor deposited to a film thickness of 1 nm instead of LiF. When the characteristics of the organic EL element were measured, the brightness at a current density of 10 mA/cm$^2$ was 18 cd/m$^2$, and the driving voltage was 5.50 V. Upon constant current driving at this current density, the brightness half-life was 5 hours. Also, numerous dark spots were generated on the light emitting side. Similar results were obtained when MgO was used instead of BaO.

Comparative Example 5

An organic EL element for Comparative Example 5 was obtained in the same manner as in Example 1, except that the organic thin-film layer and modified section were not formed, and polyparaphenylene was vapor deposited to a film thickness of 2 nm. When the characteristics of the organic EL element were measured, the brightness at a current density of 10 mA/cm$^2$ was 0 cd/m$^2$, and the driving voltage was 10 V. The brightness half-life was unmeasurable.

An organic EL element of the invention exhibits adequately high luminescent efficiency and a long usable life, even when using as a structural material of the luminescent layer a luminescent polymer compound which has high reliability particularly during fabrication steps and allows reduction in production cost. This type of organic EL element can be obtained by the fabrication process for an organic EL element of the invention.

What is claimed is:

1. An organic EL element provided with a substrate, a first electrode layer and second electrode layer situated in a mutually opposing manner on one side of the substrate, and a luminescent layer situated between the electrode layers,
   wherein one of said first electrode layer and said second electrode layer is a hole injection electrode layer and the other is an electron injection electrode layer, and
   there is formed between said luminescent layer and said electron injection electrode layer an organic thin-film layer composed of only an organic polymer compound which satisfies the following inequality (1) and inequality (2), and
   wherein the organic thin-film layer has a film thickness of 0.05-10 nm, $$|EA_{LL}| - |EA_{OTL}| \geq 0.3 \text{ eV} \quad (1)$$

$$|IP_{OTL}| - |IP_{LL}| \geq 0.3 \text{ eV} \quad (2)$$

where $EA_{LL}$ is the electron affinity of said luminescent layer, $EA_{OTL}$ is the electron affinity of said organic thin-film layer, $IP_{OTL}$ is the ionization potential of said organic thin-film layer, and $IP_{LL}$ is the ionization potential of said luminescent layer.

2. An organic EL element according to claim 1, wherein the film thickness of said organic thin-film layer is 0.1-4 nm.

3. An organic EL element according to claim 1, wherein said organic polymer compound satisfying inequality (1) and inequality (2) is a polar organic polymer compound.

4. An organic EL element according to claim 3, wherein said polar organic polymer compound consists of one or more of the following organic polymer compounds (a) to (c) (where the organic polymer compounds of (a) to (c) may have substituents),
   (a) polymers or copolymers of compounds selected from the group consisting of vinylpyridine, (meth)acrylic acid, N-alkylacrylamide, N,N-dialkylacrylamide, hydroxy(meth)acrylate, vinyl acetate, styrene and N-vinylpyrrolidone,
   (b) oxyalkylene polymers or copolymers wherein the alkyl groups have 2-4 carbon atoms, and
   (c) polyoxazoline or polyvinylbutyral.

5. An organic EL element according to claim 3, wherein said polar organic polymer compound is one or more organic polymer compounds selected from the group consisting of poly(2-vinylpyridine), poly(4-vinylpyridine), polyacrylic acid, polymethacrylic acid, poly(N,N-dimethylacrylamide), poly(2-hydroxyethyl acrylate), poly(2-hydroxyethyl methacrylate), poly-N-vinylpyrrolidone, polyvinyl acetate, polystyrene, substituted polystyrene, polyethylene glycol, polypropylene glycol, poly(tetramethylene ether) glycol, poly(2-ethyl-2-oxazoline) and polyvinylbutyral.

6. An organic EL element according to claim 1, wherein the number average molecular weight of said organic polymer compound satisfying inequality (1) and inequality (2) is 50000 or greater.

7. An organic EL element according to claim 1, wherein said organic thin-film layer is formed by coating a solution comprising a solvent and said organic polymer compound satisfying inequality (1) and inequality (2).

8. An organic EL element according to claim 7, wherein said solvent comprises a polar solvent.

9. An organic EL element according to claim 8, wherein said polar solvent is one or more polar solvents selected from the group consisting of hydroxyl group-containing linear compounds with a total of 1-10 carbon atoms, $C_{2-6}$ dialkylamide group-containing linear compounds with a total of 2-8 carbon atoms, linear esters with a total of 2-10 carbon atoms and linear carbonates with a total of 2-9 carbon atoms.

10. An organic EL element according to claim 1, wherein on said hole injection electrode layer side of said electron injection electrode layer, there is provided an electron injection layer adjacent to said electron injection electrode layer and composed of a compound containing an alkali metal, alkaline earth metal or rare earth metal.

11. An organic EL element according to claim 10, wherein the total thickness of said electron injection layer and said organic thin-film layer is 0.5-25 nm.

12. An organic EL element according to claim 1, wherein said luminescent layer contains an electron transport material.

13. An organic EL element according to claim 12, wherein said electron transport material is at least one selected from organic metal complexes of oxadiazole derivatives, anthraquinodimethane or its derivatives, benzoquinone or its derivatives, naphthoquinone or its derivatives, anthraquinone or its derivatives, tetracyanoanthraquinodimethane or its derivatives, fluorene or its derivatives, diphenyldicyanoethylene or its derivatives, diphenoquinone derivatives, and 8-hydroxyquinoline or its derivatives.

14. An organic EL element according to claim 1, wherein the hole injection layer is on a light emerging side of the organic EL,
   a film thickness of said hole injection electrode layer is 50-300 nm, and
   a transmittance of the hole injection layer at 400-700 nm is 80% or greater.

15. An organic EL element provided with a substrate, a first electrode layer and second electrode layer situated in a mutually opposing manner on one side of the substrate, and a luminescent layer situated between the electrode layers,
   wherein one of said first electrode layer and said second electrode layer is a hole injection electrode layer and the other is an electron injection electrode layer, and
   there is formed between said luminescent layer and said electron injection electrode layer an organic thin-film layer composed of only an organic polymer compound with an energy gap of 3.5 eV or greater,
   wherein the organic thin-film layer has a film thickness of 0.05-10 nm.

16. An organic EL element according to claim 15, wherein said organic polymer compound with an energy gap of 3.5 eV or greater is a polar organic polymer compound.

17. An organic EL element according to claim 15, wherein the number average molecular weight of said organic polymer compound with an energy gap of 3.5 eV or greater is 50000 or greater.

18. An organic EL element according to claim 15, wherein said organic thin-film layer is formed by coating a solution comprising a solvent and said organic polymer compound with an energy gap of 3.5 eV or greater.

19. An organic EL element according to claim 18, wherein said solvent comprises a polar solvent.

20. An organic EL element according to claim 19, wherein said polar solvent is one or more polar solvents selected from the group consisting of hydroxyl group-containing linear compounds with a total of 1-10 carbon atoms, $C_{2-6}$ dialkylamide group-containing linear compounds with a total of 2-8 carbon atoms, linear esters with a total of 2-10 carbon atoms and linear carbonates with a total of 2-9 carbon atoms.

21. An organic EL element according to claim 15, wherein the film thickness of said organic thin-film layer is 0.1-4 nm.

22. An organic EL element according to claim 15, wherein on said hole injection electrode layer side of said electron injection electrode layer, there is provided an electron injection layer adjacent to said electron injection electrode layer and composed of a compound containing an alkali metal, alkaline earth metal or rare earth metal.

23. An organic EL element according to claim 22, wherein the total thickness of said electron injection layer and said organic thin-film layer is 0.5-25 nm.

24. An organic EL element according to claim 16, wherein said polar organic polymer compound consists of one or more of the following organic polymer compounds (a) to (c) (where the organic polymer compounds of (a) to (c) may have substituents):
(a) polymers or copolymers of compounds selected from the group consisting of vinylpyridine, (meth)acrylic acid, N-alkylacrylamide, N,N-dialkylacrylamide, hydroxy(meth)acrylate, vinyl acetate, styrene and N-vinylpyrrolidone;
(b) oxyalkylene polymers or copolymers wherein the alkyl groups have 2-4 carbon atoms; and
(c) polyoxazoline or polyvinylbutyral.

25. An organic El element according to claim 16, wherein said polar organic polymer compound is one or more organic polymer compounds selected from the group consisting of poly(2-vinylpyridine), poly(4-vinylpyridine), polyacrylic acid, polymethacrylic acid, poly(N,N-dimethylacrylamide), poly(2-hydroxyethyl acrylate), poly(2-hydroxyethyl methacrylate), poly-N-vinylpyrrolidone, polyvinyl acetate, polystyrene, substituted polystyrene, polyethylene glycol, polypropylene glycol, poly(tetramethylene ether) glycol, poly(2-ethyl-2-oxazoline) and polyvinylbutyral.

26. An organic EL element according to claim 15, wherein said luminescent layer contains an electron transport material.

27. An organic EL element according to claim 26, wherein said electron transport material is at least one selected from organic metal complexes of oxadiazole derivatives, anthraquinodimethane or its derivatives, benzoquinone or its derivatives, naphthoquinone or its derivatives, anthraquinone or its derivatives, tetracyanoanthraquinodimethane or its derivatives, fluorene or its derivatives, diphenyldicyanoethylene or its derivatives, diphenoquinone derivatives, and 8-hydroxyquinoline or its derivatives.

28. A process for fabrication of an organic EL element comprising a step of forming a first electrode layer on one side of a substrate, a step of layer formation on said first electrode layer in such a manner that at least one layer is a luminescent layer, and a step of forming a second electrode layer on the uppermost layer laminated in the previous step,
wherein one of said first electrode layer and said second electrode layer is formed as a hole injection electrode layer and the other is formed as an electron injection electrode layer, and
there is formed as a layer between said luminescent layer and said electron injection electrode layer, an organic thin-film layer composed of only an organic polymer compound satisfying the following inequality (1) and inequality (2),
wherein the organic thin-film layer has a film thickness of 0.05-10 nm, $$|EA_{LL}|-|EA_{OTL}| \geqq 0.3 \text{ eV} \tag{1}$$

$$|IP_{OTL}|-|IP_{LL}| \geqq 0.3 \text{ eV} \tag{2}$$

where $EA_{LL}$ is the electron affinity of said luminescent layer, $EA_{OTL}$ is the electron affinity of said organic thin-film layer, $IP_{OTL}$ is the ionization potential of said organic thin-film layer, and $IP_{LL}$ is the ionization potential of said luminescent layer.

29. A process for fabrication of an organic EL element according to claim 28,
wherein on said hole injection electrode layer side of said electron injection electrode layer, there is formed an electron injection layer adjacent thereto and composed of a compound containing an alkali metal, alkaline earth metal or rare earth metal.

30. A process for fabrication of an organic EL element comprising a step of forming a first electrode layer on one side of a substrate, a step of layer formation on said first electrode layer in such a manner that at least one layer is a luminescent layer, and a step of forming a second electrode layer on the uppermost layer laminated in the previous step,
wherein one of said first electrode layer and said second electrode layer is formed as a hole injection electrode layer and the other is formed as an electron injection electrode layer, and
there is formed as a layer between said luminescent layer and said electron injection electrode layer, an organic thin-film layer composed of only an organic polymer compound with an energy gap of 3.5 eV or greater,
wherein the organic thin-film layer has a film thickness of 0.05-10 nm.

31. A process for fabrication of an organic EL element according to claim 30,
wherein on said hole injection electrode layer side of said electron injection electrode layer, there is formed an electron injection layer adjacent thereto and composed of a compound containing an alkali metal, alkaline earth metal or rare earth metal.

* * * * *